United States Patent
Park et al.

(10) Patent No.: US 9,159,767 B2
(45) Date of Patent: Oct. 13, 2015

(54) METHODS OF MANUFACTURING MAGNETORESISTIVE RANDOM ACCESS MEMORY DEVICES

(71) Applicants: Jong-Chul Park, Seongnam-si (KR); Gwang-Hyun Baek, Seoul (KR); Hyung-Joon Kwon, Seongnam-si (KR); In-Ho Kim, Suwon-si (KR); Chang-Woo Sun, Hwaseong-si (KR)

(72) Inventors: Jong-Chul Park, Seongnam-si (KR); Gwang-Hyun Baek, Seoul (KR); Hyung-Joon Kwon, Seongnam-si (KR); In-Ho Kim, Suwon-si (KR); Chang-Woo Sun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/182,316

(22) Filed: Feb. 18, 2014

(65) Prior Publication Data
US 2014/0264672 A1    Sep. 18, 2014

(30) Foreign Application Priority Data
Mar. 14, 2013    (KR) .................. 10-2013-0027017

(51) Int. Cl.
*H01L 43/12*    (2006.01)
*H01L 27/22*    (2006.01)

(52) U.S. Cl.
CPC .............. *H01L 27/228* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 5,443,993 A * | 8/1995 | Park et al. .................. | 438/396 |
| 6,560,135 B2 | 5/2003 | Matsuoka et al. | |
| 6,944,048 B2 | 9/2005 | Iwata | |
| 7,642,572 B2 * | 1/2010 | Popp et al. .................. | 257/211 |
| 7,706,175 B2 | 4/2010 | Hosotani et al. | |
| 2008/0121616 A1 | 5/2008 | Chen | |
| 2010/0221848 A1 | 9/2010 | Keshtbod et al. | |
| 2010/0246253 A1 | 9/2010 | Ashida | |
| 2010/0270602 A1 * | 10/2010 | Choi ............................ | 257/296 |
| 2011/0101298 A1 * | 5/2011 | Tang et al. ................... | 257/5 |
| 2012/0299090 A1 * | 11/2012 | Kim et al. ..................... | 257/331 |
| 2012/0326214 A1 * | 12/2012 | Cho .............................. | 257/288 |
| 2013/0043530 A1 * | 2/2013 | Kim et al. ..................... | 257/334 |

FOREIGN PATENT DOCUMENTS

| JP | 2010-287815 | 12/2010 |
|---|---|---|
| KR | 1020090049524 A | 5/2009 |
| KR | 1020090123691 A | 12/2009 |

OTHER PUBLICATIONS

Abe et al. "Novel Hybrid DRAM/MRAM Design for Reducing Power of High Performance Mobile CPU," 2012, IEEE, pp. 10.5.1-10.5.4.*

* cited by examiner

*Primary Examiner* — Kimberly Rizkallah
*Assistant Examiner* — Bo Bin Jang
(74) *Attorney, Agent, or Firm* — Myers Bigel Sibley & Sajovec, P.A.

(57) ABSTRACT

In a method of an MRAM device, first and second patterns are formed on a substrate alternately and repeatedly in a second direction. Each first pattern and each second pattern extend in a first direction perpendicular to the second direction. Some of the second patterns are removed to form first openings extending in the first direction. Source lines filling the first openings are formed. A mask is formed on the first and second patterns and the source lines. The mask includes second openings in the first direction, each of which extends in the second direction. Portions of the second patterns exposed by the second openings are removed to form third openings. Third patterns filling the third openings are formed. The second patterns surrounded by the first and third patterns are removed to form fourth openings. Contact plugs filling the fourth openings are formed.

20 Claims, 37 Drawing Sheets

FIG. 1
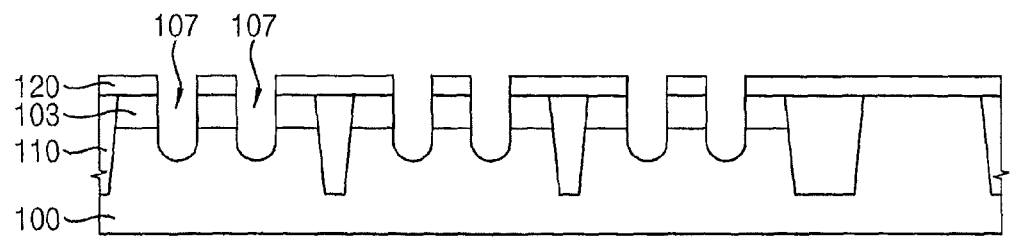
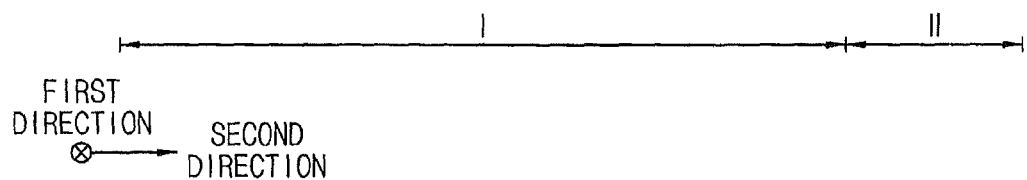
FIG. 2
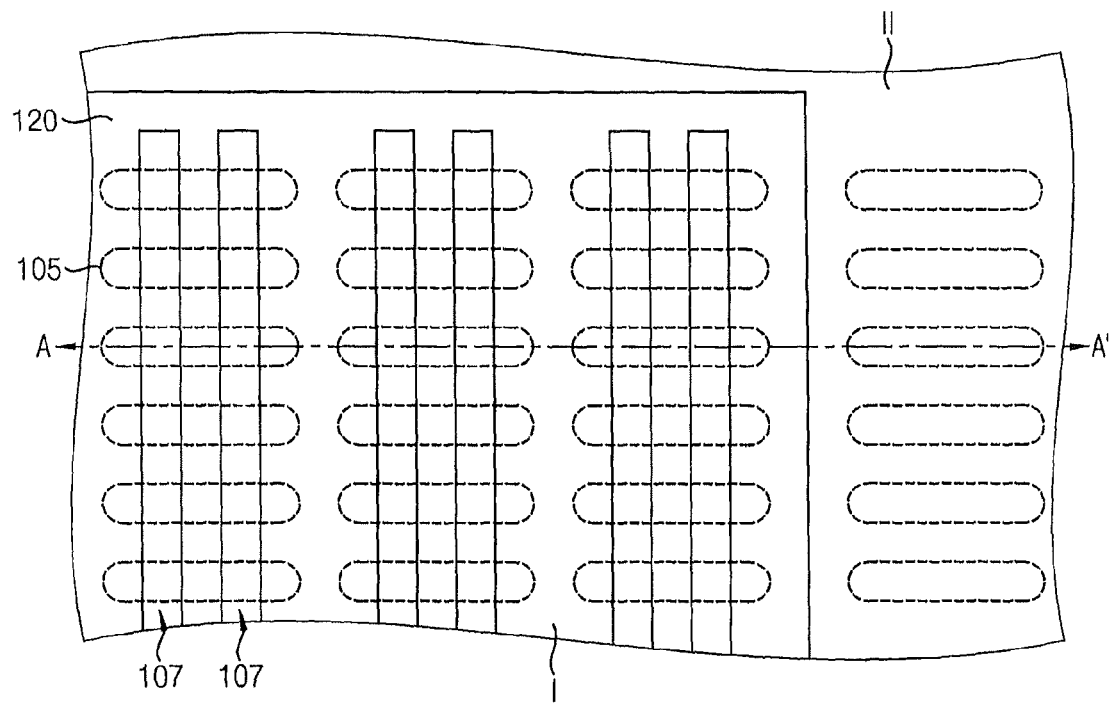
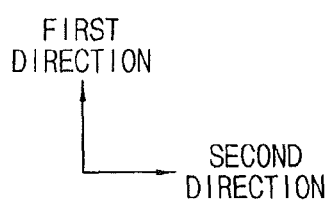

FIG. 44
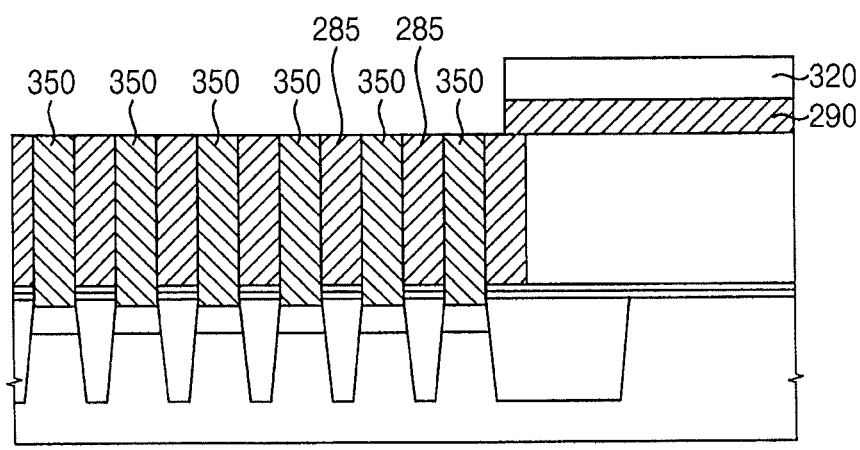

METHODS OF MANUFACTURING MAGNETORESISTIVE RANDOM ACCESS MEMORY DEVICES

CROSS-REFERENCE TO RELATED APPLICATION

This application claims priority under 35 U.S.C. §119 to Korean Patent Application No. 10-2013-0027017, filed on Mar. 14, 2013 in the Korean Intellectual Property Office (KIPO), the contents of which are incorporated herein by reference in their entirety.

BACKGROUND

Example embodiments relate to semiconductor devices and methods of manufacturing the same. More particularly, example embodiments relate to magnetoresistive random access memory (MRAM) devices and methods of manufacturing the same.

MRAM devices may include contact plugs and source lines that are electrically connected to a plurality of magnetic tunnel junction (MTJ) structures. The contact plugs and the source lines may be formed to have a small size and to be adjacent to each other due to the decrease of a design rule.

SUMMARY

Example embodiments provide a method of manufacturing an MRAM device having fine patterns.

Example embodiments provide an MRAM device including fine elements that exhibit good characteristics.

According to example embodiments, there is provided a method of manufacturing an MRAM device. In the method, first and second patterns are formed on a substrate alternately and repeatedly in a second direction that is substantially parallel to a top surface of the substrate. Each of the first patterns and each of the second patterns extend in a first direction that is substantially parallel to the top surface of the substrate and substantially perpendicular to the second direction. Some of the second patterns are removed to form first openings each of which extends in the first direction. Source lines are formed in the first openings. A mask is formed on the first and second patterns and the source lines. The mask includes a plurality of second openings that are spaced apart from each other in the first direction, each of the second openings extending in the second direction. Portions of the second patterns that are exposed by the second openings are removed to form third openings. Third patterns are formed in the third openings. The second patterns that are surrounded by the first and third patterns are removed to form fourth openings. Contact plugs are formed in the fourth openings.

In example embodiments, a wet etching process may be used to form both the first openings and the fourth openings.

In example embodiments, the first and third patterns may comprise substantially the same material.

In example embodiments, the source lines and the contact plugs may each comprise a conductive material.

In example embodiments, forming the first openings may comprise removing each (3n−2)th of the second patterns when the second patterns are counted along the second direction. Here, n is a positive integer.

In example embodiments, a first capping layer may be formed on the first and second patterns.

In example embodiments, the first capping layer may comprise a material that is substantially the same as that of the first patterns.

In example embodiments, when the first openings are formed, upper portions of selected ones of the second patterns and upper portions of the first patterns adjacent thereto may be removed by a dry etching process to form recesses while other of the second patterns are not etched. Lower portions of the selected ones of the second patterns may be removed by a wet etching process to form the first openings that are in fluid communication with the recesses.

In example embodiments, when the source lines are formed, a conductive layer may be formed in the first openings and in the recesses. Portions of the conductive layer in the recesses may be removed.

In example embodiments, a second capping layer filling the recesses may be further formed after removing the portions of the conductive layer in the recesses.

In example embodiments, the second capping layer may comprise a material substantially the same as that of the first patterns.

In example embodiments, when the third openings are formed, the portions of the second patterns exposed by the second openings may be removed by a dry etching process, and the source lines may be protected by the second capping layer during the dry etching process.

In example embodiments, the first and second patterns may comprise silicon nitride and silicon oxide, respectively.

In example embodiments, when the first and second patterns are formed, a plurality of sacrificial layer patterns may be formed on the substrate. Each of the sacrificial layer patterns may extend in the first direction, and the sacrificial layer patterns may be spaced apart from each other in the second direction. First spacers may be formed on sidewalls of the sacrificial layer patterns. The sacrificial layer patterns may be removed. Second spacers that contact the first spacers may be formed. A filling layer filling spaces between the second spacers may be formed on the substrate. Upper portions of the first and second spacers and the filling layer may be removed so that the first spacers and the filling layer may be converted to the first patterns and the second spacers may be converted to the second patterns.

According to example embodiments, methods of manufacturing an MRM device are provided in which a plurality of active regions are formed in a substrate, the active regions spaced apart from each other along a second direction. A pair of first gate structures are formed in each active region. Sacrificial patterns are formed between the pairs of first gate structures, the sacrificial patterns extending in a first direction that is perpendicular to the second direction and spaced apart from each other along the second direction. First spacers are formed on sidewalls of the sacrificial patterns, and then the sacrificial patterns are removed. Second spacers are formed that fill the openings between each pair of adjacent first spacers that overlie a common active region and that only partially fill the openings between each pair of adjacent first spacers that overlie different active regions.

According to example embodiments, there is provided an MRAM device. The MRAM device includes a plurality of buried gate structures in a substrate, a plurality of source lines, a plurality of contact plugs, a plurality of pads, and a plurality of MTJ structures. Each of the buried gate structures extends in a first direction substantially parallel to a top surface of the substrate, and the plurality of buried gate structures is disposed in a second direction substantially parallel to the top surface of the substrate and substantially perpendicular to the first direction. The plurality of source lines is on the substrate between the buried gate structures. Each of the source lines extends in the first direction, and the plurality of source lines is disposed in the second direction. The plurality of contact plugs is on the substrate between the source lines. The plurality of contact plugs does not overlap the buried gate structures and is disposed both in the first and second directions. The plurality of pads is electrically connected to the contact plugs. The plurality of MTJ structures is electrically connected to the pads.

According to example embodiments, in the method of manufacturing the MRAM device, the first and second patterns and having a minute size are formed on the substrate by triple patterning technology (TPT), the second patterns are formed by a wet etching process to form the openings, and the source lines and the contact plugs filling the openings are formed. Thus, the source lines and the contact plugs having a minute size may be easily formed, and failures due to the contact between the source lines and the contact plugs may be prevented.

BRIEF DESCRIPTION OF THE DRAWINGS

Example embodiments will be more clearly understood from the following detailed description taken in conjunction with the accompanying drawings, in which:

FIGS. 1, 3, 4, 6, 8, 9, 11, 12, 14, 15, 17, 19, 21, 23, 26, 28, 30, 32, 34, 36, 38, 39, 40, 42, 43, 44, 46, 47, 49, 51 and 53 are vertical cross-sectional views of an MRAM device according to embodiments of the inventive concept;

FIGS. 2, 5, 7, 10, 13, 16, 18, 20, 22, 24, 27, 29, 33, 35, 37, 41, 45, 48, 50, 52 and 54 are plan views of the MRAM device according to embodiments of the inventive concept.

DESCRIPTION OF EMBODIMENTS

Figure 3:
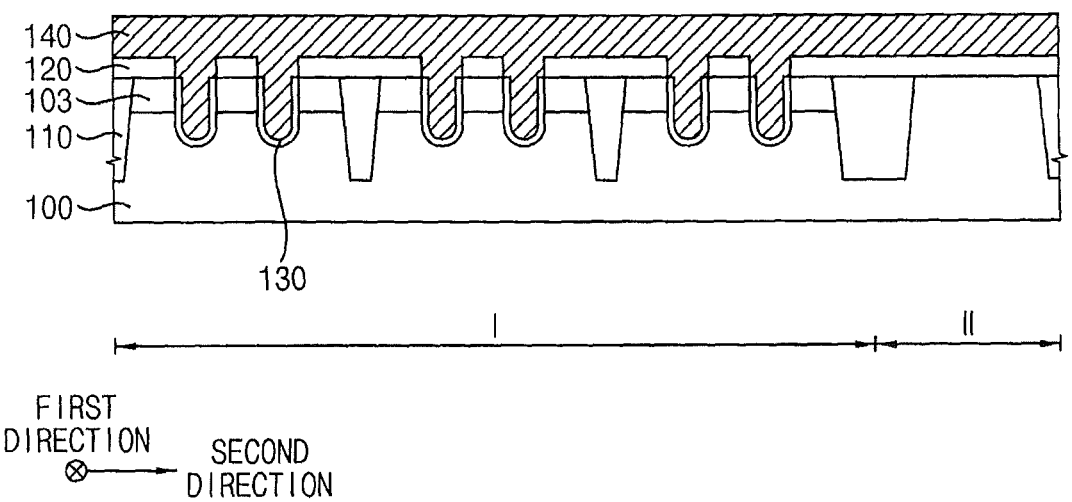

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that may include schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 40:
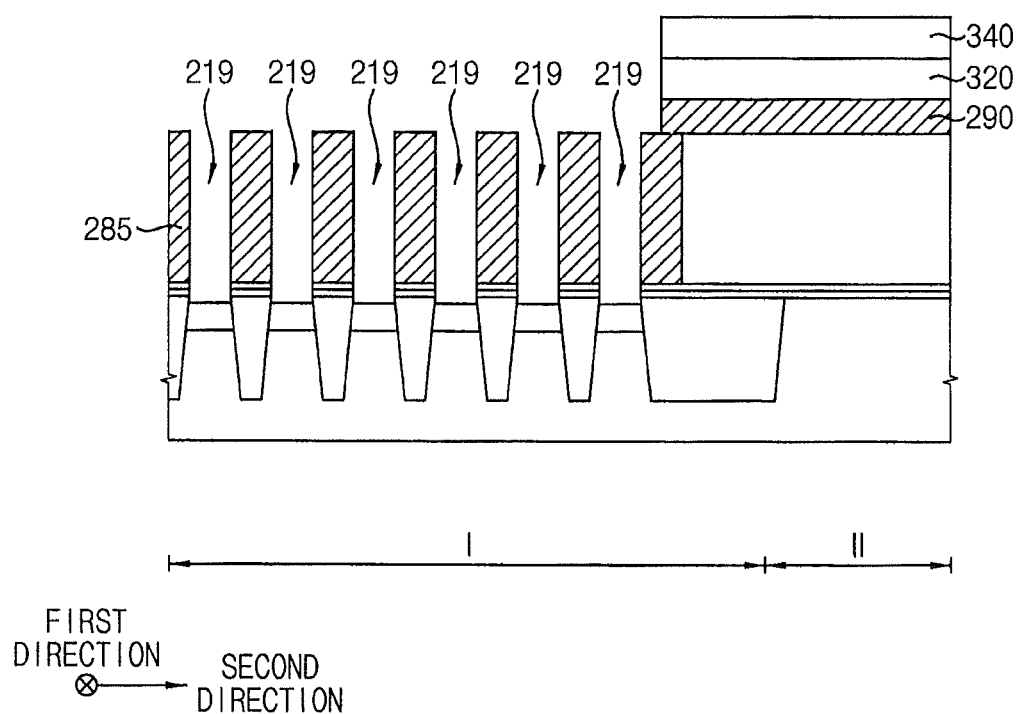
Figure 41:
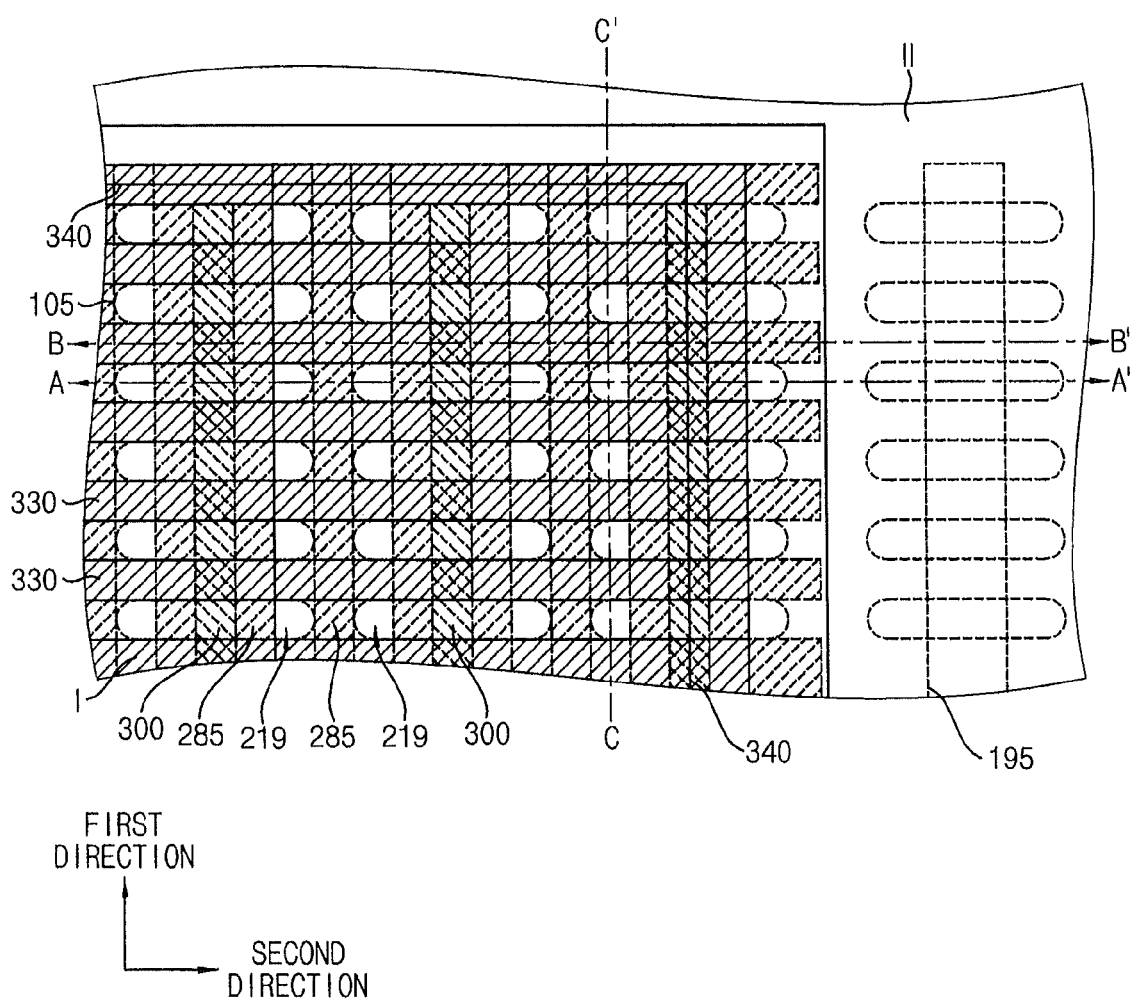
Figure 42:
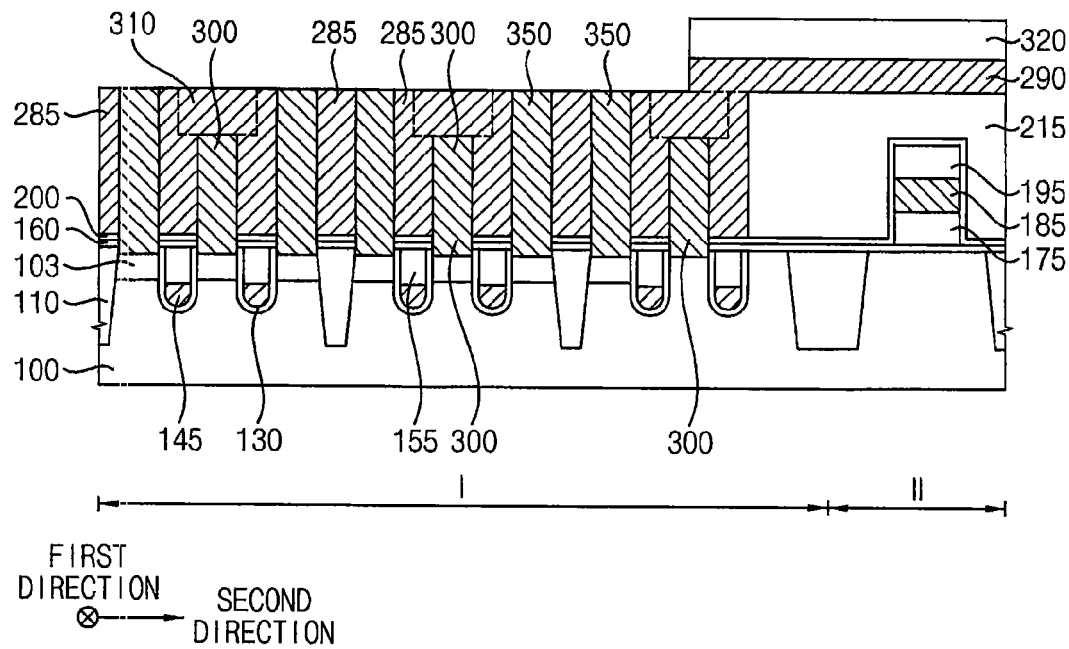
Figure 43:
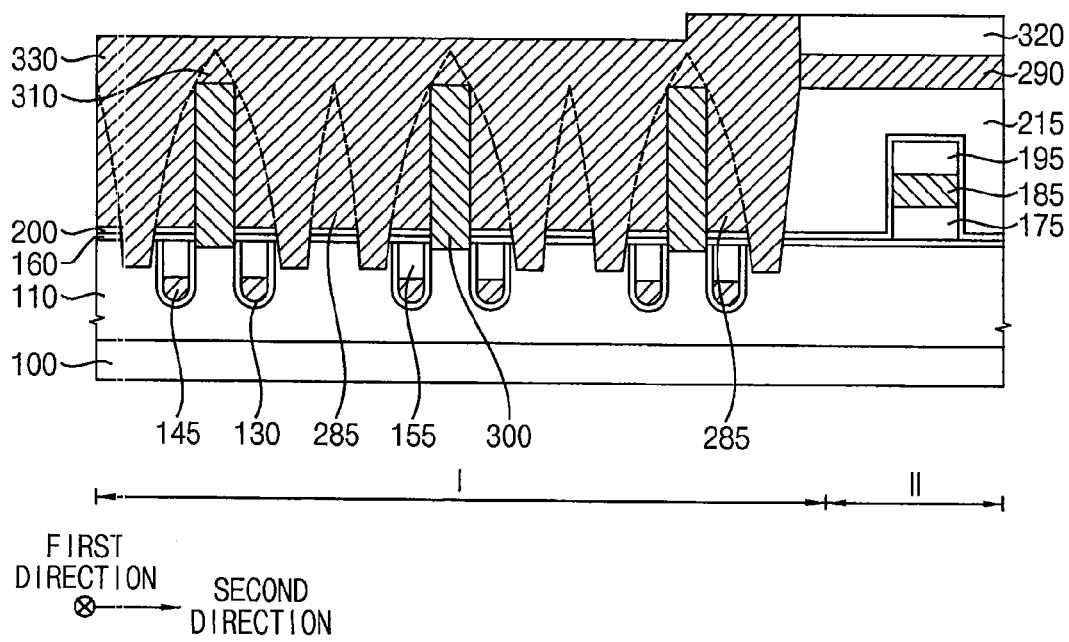
Figure 45:
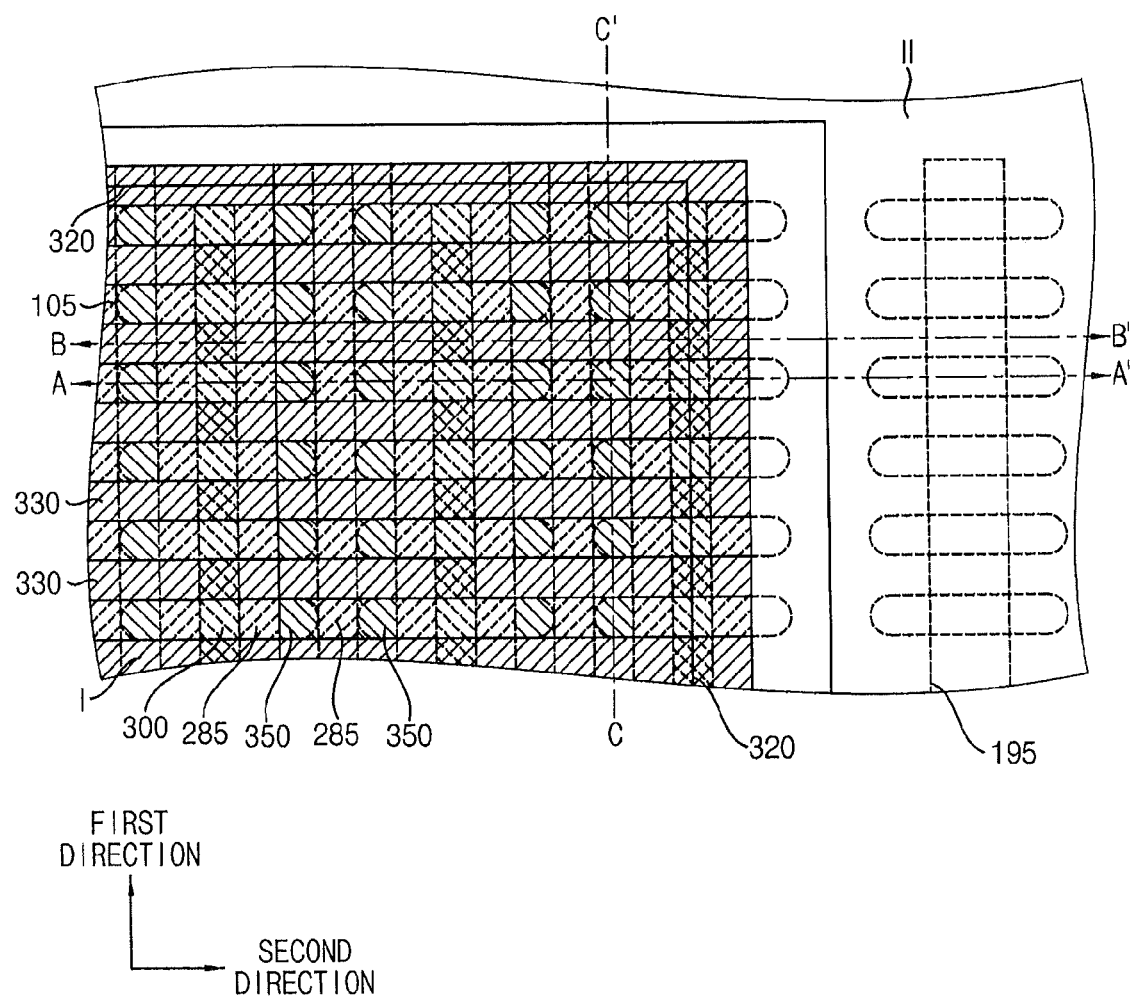
Figure 53:
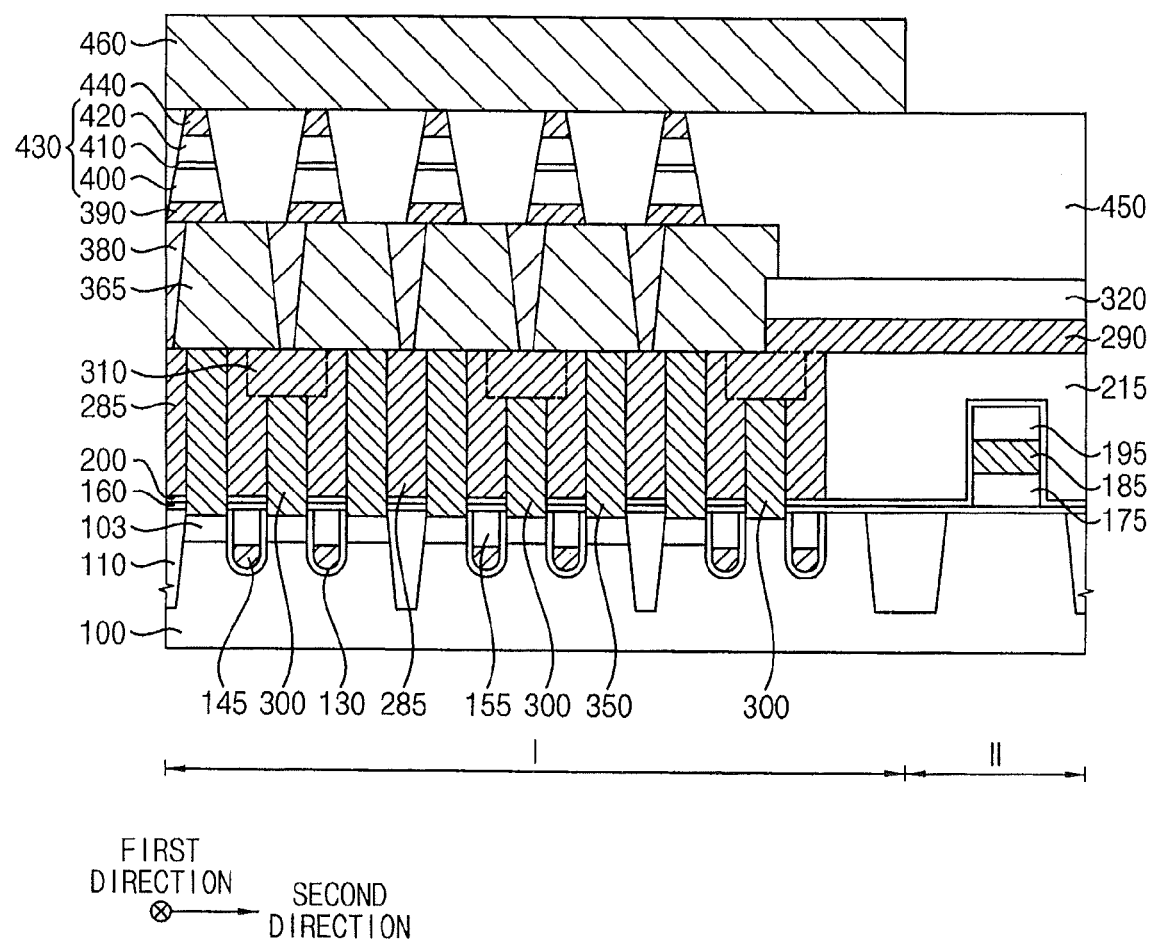
Figure 54:
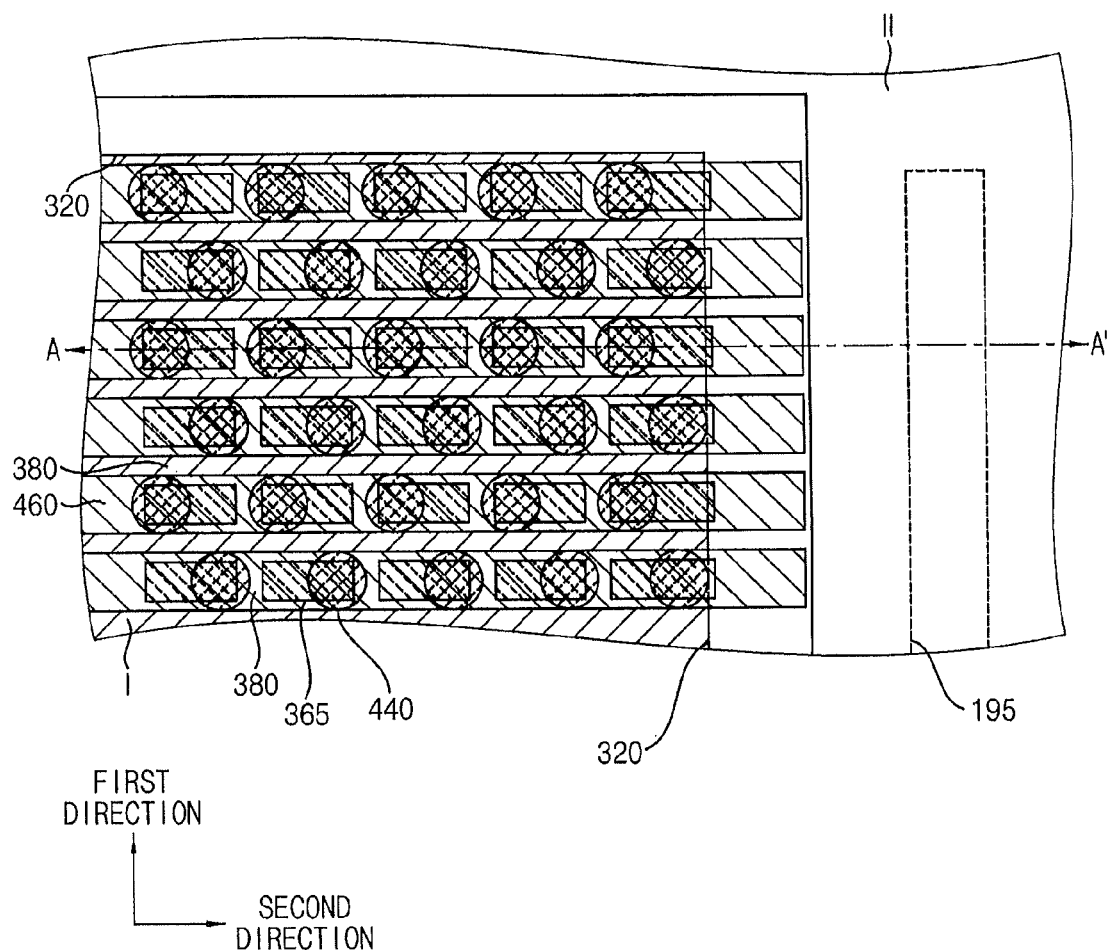

FIGS. 1 to 54 are cross-sectional views and plan views illustrating stages of a method of manufacturing an MRAM device in accordance with example embodiments. Particularly, FIGS. 2, 5, 7, 10, 13, 16, 18, 20, 22, 24, 27, 29, 33, 35, 37, 41, 45, 48, 50, 52 and 54 are plan views of the MRAM device, FIGS. 1, 3, 4, 6, 8, 9, 11, 12, 14, 15, 17, 19, 21, 23, 26, 28, 30, 32, 38, 42, 46, 47, 49, 51 and 53 are vertical cross-sectional views taken along a line A-A', FIGS. 34, 36, 39 and 43 are vertical cross-sectional views taken along a line B-B', and FIGS. 40 and 44 are vertical cross-sectional views taken along a line C-C', FIG. 25 is a horizontal cross-sectional view taken along a line D-D', and FIG. 31 is a horizontal cross-sectional view taken along a line E-E'. In the discussion that follows, the first direction and the second direction define a horizontal plane, and the vertical direction is perpendicular to the horizontal plane.

Referring to FIGS. 1 and 2, impurities may be implanted into an upper portion of a substrate 100 in a first region I to form a plurality of impurity regions 103, and an isolation layer 110 may be formed on the substrate 100 to divide the substrate 100 into active regions 105 and a field region.

The substrate 100 may be a silicon substrate, a germanium substrate, a silicon-germanium substrate, a silicon-on-insulator (SOI) substrate, a germanium-on-insulator (GOI) substrate, etc. The substrate 100 may include the first region I in which memory cells may be formed and a second region II in which peripheral circuits may be formed.

The impurities may include n-type impurities, e.g., phosphorous, arsenic, etc., or p-type impurities, e.g., boron, gallium, etc. The impurity regions 103 may serve as source/drain regions of the memory cells of the MRAM device.

The isolation layer 110 may be formed by a shallow trench isolation (STI) process. Particularly, after forming a first trench (not shown) at an upper portion of the substrate 100, an insulation layer sufficiently filling the first trench may be formed on the substrate 100, and an upper portion of the insulation layer may be planarized until a top surface of the substrate 100 is exposed. The insulation layer may be formed by a chemical vapor deposition (CVD) process, a high density plasma chemical vapor deposition (HDP-CVD) process, etc. In an example embodiment, before forming the isolation layer 110, a liner (not shown) may be formed on an inner wall of the first trench using a nitride.

The impurity regions 103 may be formed either before or after the isolation layer 110 is formed.

The substrate 100 may be partially removed to form second trenches 107.

In example embodiments, a first mask layer may be formed on the substrate 100, and the first mask layer may be patterned by a photolithography process to form a first mask 120. An upper portion of the substrate 100 may be etched using the first mask 120 as an etching mask to form the second trenches 107. In example embodiments, the second trenches 107 may be formed to extend in a first direction that is substantially parallel to a top surface of the substrate 100. As shown in FIG. 2 a plurality of second trenches 107 may be formed, and these second trenches 107 may be spaced apart from each other in a second direction that is substantially parallel to the top surface of the substrate 100 and substantially perpendicular to the first direction. In an example embodiment, two second trenches 107 may be formed within each active region 105.

The first mask layer may include, e.g., silicon oxide.

Referring to FIG. 3, a first gate insulation layer 130 may be formed on inner walls of the second trenches 107, and a first gate electrode layer 140 may be formed on the first gate insulation layer 130 and the first mask 120 to sufficiently fill the second trenches 107.

In example embodiments, the first gate insulation layer 130 may be formed by a thermal oxidation process or a radical oxidation process that is performed on an upper portion of the substrate 100 that is exposed by the second trench 107. In other example embodiments, the first gate insulation layer 130 may be formed by depositing a silicon oxide layer or a metal oxide layer on inner walls of the second trenches 107 and the first mask 120 through, e.g., a CVD process, and by then removing portions of the silicon oxide layer or the metal oxide layer that are on the first mask 120. The metal layer may include, e.g., hafnium oxide, tantalum oxide, zirconium oxide, etc.

The first gate electrode layer 140 may include a metal or a metal nitride, e.g., tungsten, titanium nitride, tantalum nitride, etc., and/or a metal silicide. The first gate electrode layer 140 may be formed by an atomic layer deposition (ALD) process, a physical vapor deposition (PVD) process, etc.

Figure 4:
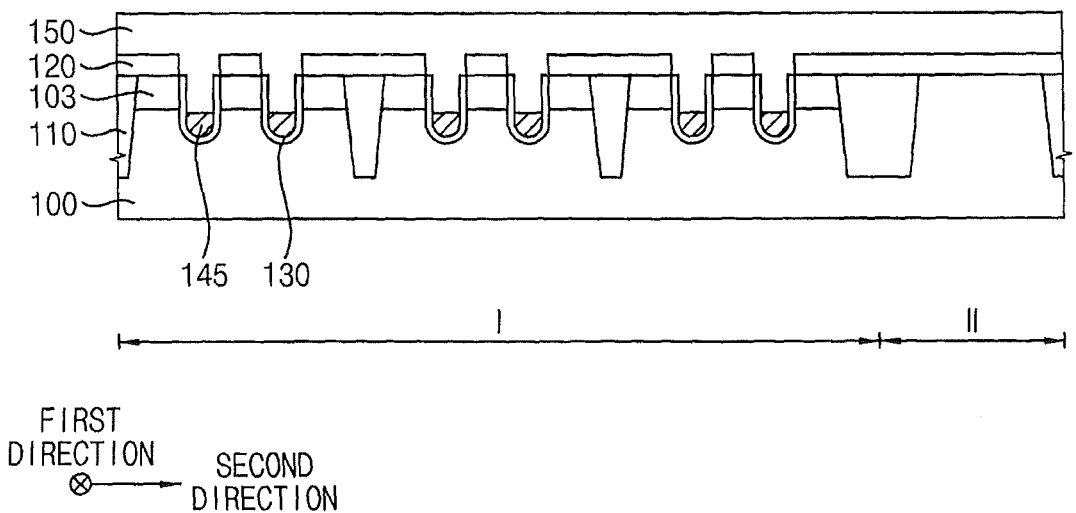
Figure 5:
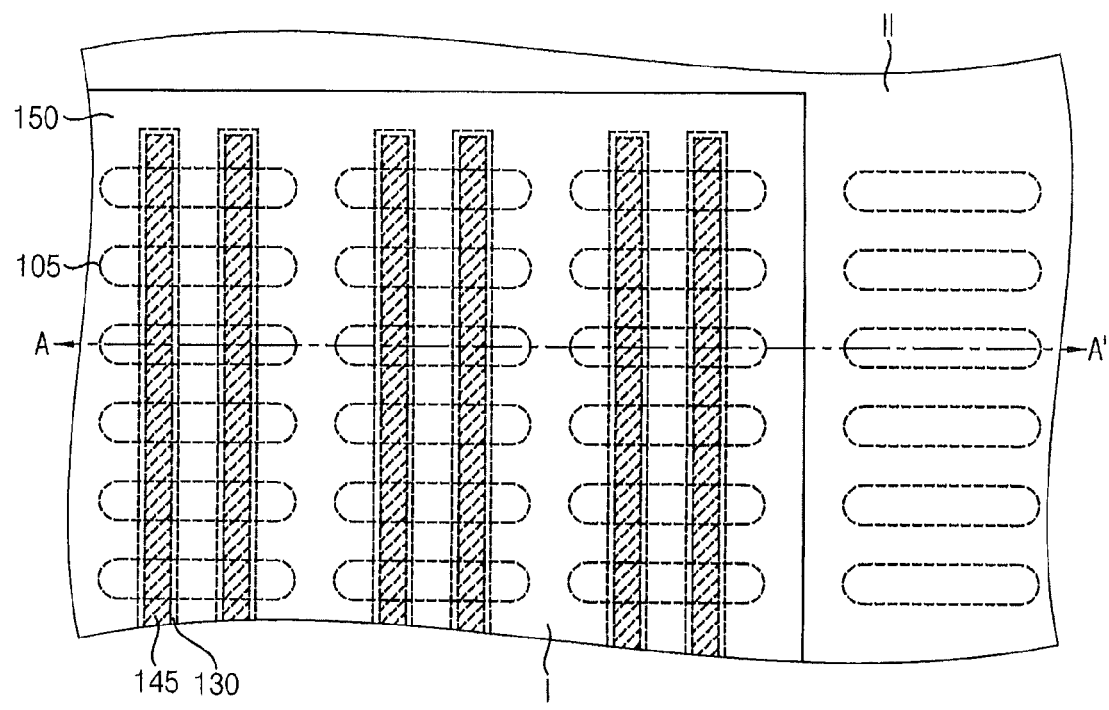

Referring to FIGS. 4 and 5, an upper portion of the first gate electrode layer 140 may be removed to form first gate electrodes 145 that partially fill the second trenches 107, and a first capping layer 150 that fills remaining portions of the second trenches 107 may be formed on the first gate electrodes 145, the first gate insulation layer 130 and the first mask 120.

In example embodiments, an upper portion of the first gate electrode layer 140 may be planarized by, e.g., a chemical mechanical polishing (CMP) process and/or an etch back process, and portions of the first gate electrode layer 140 that are in the second trenches 107 may be further removed by an anisotropic etching process to form the first gate electrodes 145. Thus, the first gate electrodes 145 may fill lower portions of the second trenches 107. In example embodiments, each first gate electrode 145 may extend in the first direction, and the first gate electrodes 145 may be spaced apart from each other along the second direction.

The first capping layer 150 may include, e.g., silicon oxide, silicon nitride, etc.

Figure 6:
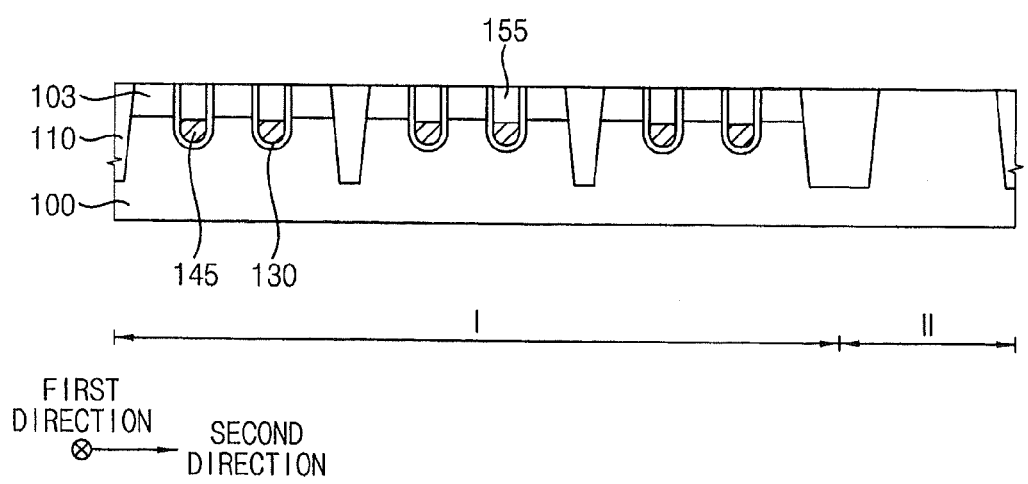
Figure 7:
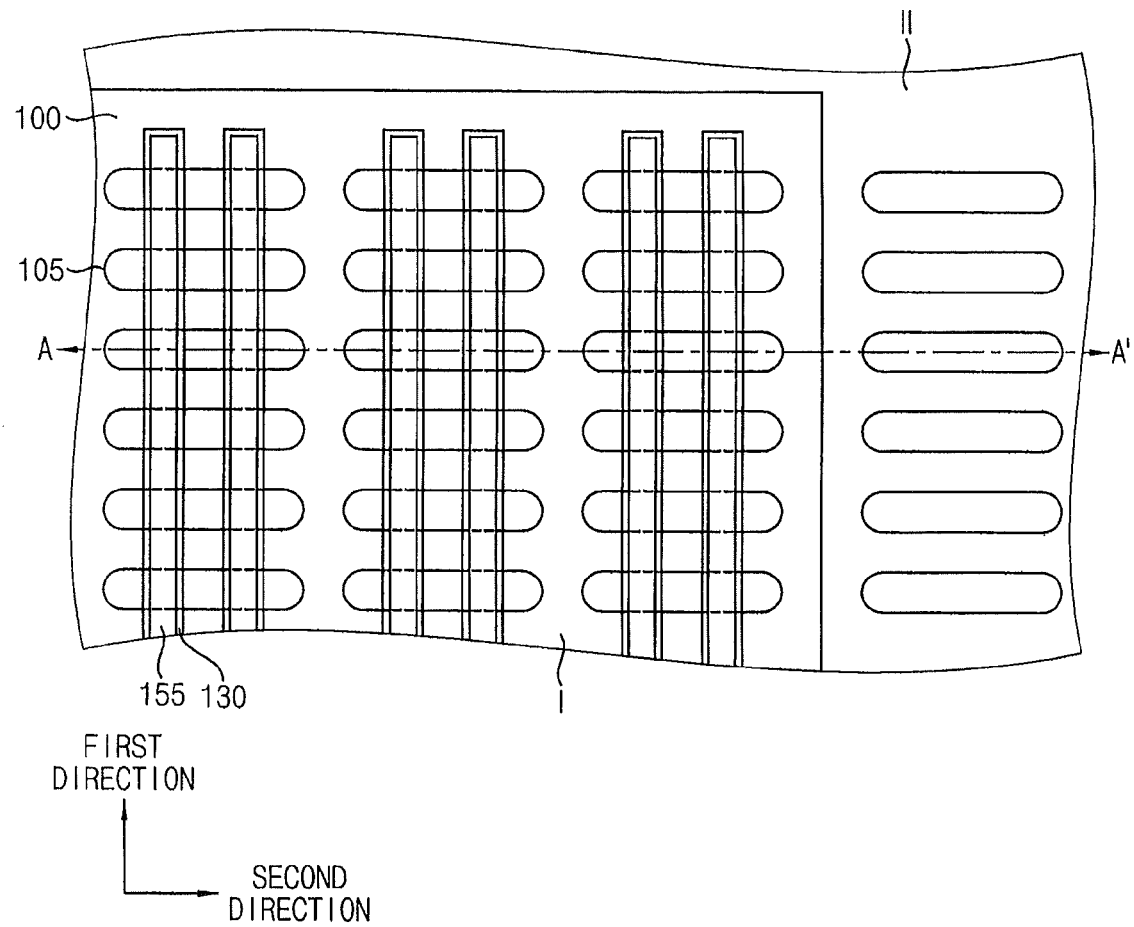

Referring to FIGS. 6 and 7, an upper portion of the first capping layer 150 and the first mask 120 may be removed to expose a top surface of the substrate 100 to form first capping layer patterns 155. A CMP process and/or an etch back process may be used to form the first capping layer patterns 155.

The first capping layer patterns 155 may fill upper portions of the respective second trenches 107. In example embodiments, the first capping layer pattern 155 may extend in the first direction, and the first capping layer patterns 155 may be spaced apart from each other in the second direction.

The first gate insulation layer 130, the first gate electrodes 145 and the first capping layer patterns 155 may form first gate structures. The first gate structures may be buried gate structures that fill the second trenches 107. The first gate structures and the impurity regions 103 may form transistors.

Figure 8:
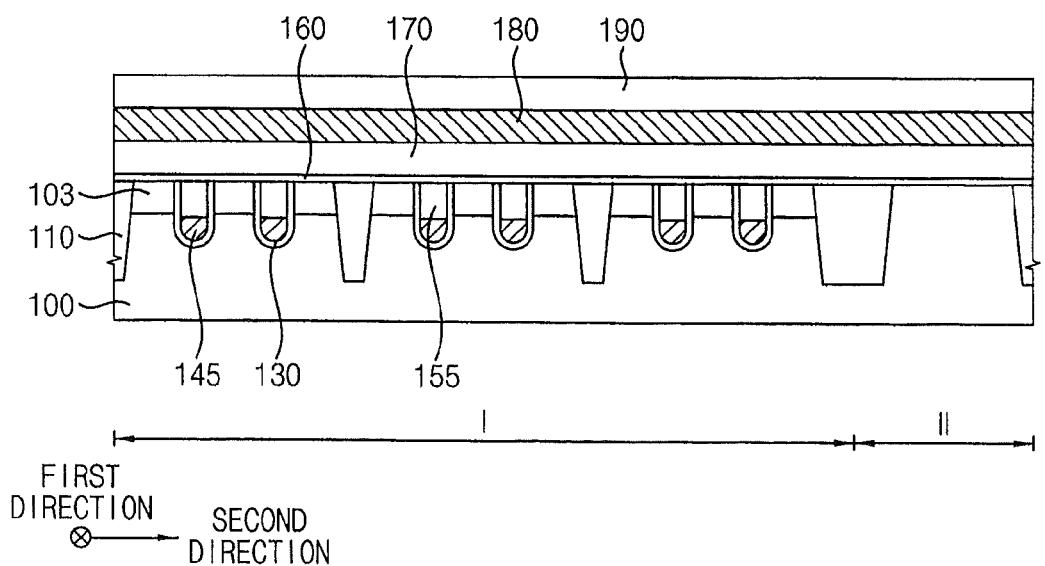

Referring to FIG. 8, a second gate insulation layer 160, a second gate electrode layer 170, a third gate electrode layer 180 and a second mask layer 190 may be sequentially formed on the first gate structures, the substrate 100 and the isolation layer 110.

The second gate insulation layer 160 may include, e.g., silicon oxide, the second gate electrode layer 170 may include, e.g., doped polysilicon, the third gate electrode layer 180 may include, e.g., a metal and/or a metal nitride, and the second mask layer 190 may include, e.g., silicon nitride.

Figure 9:
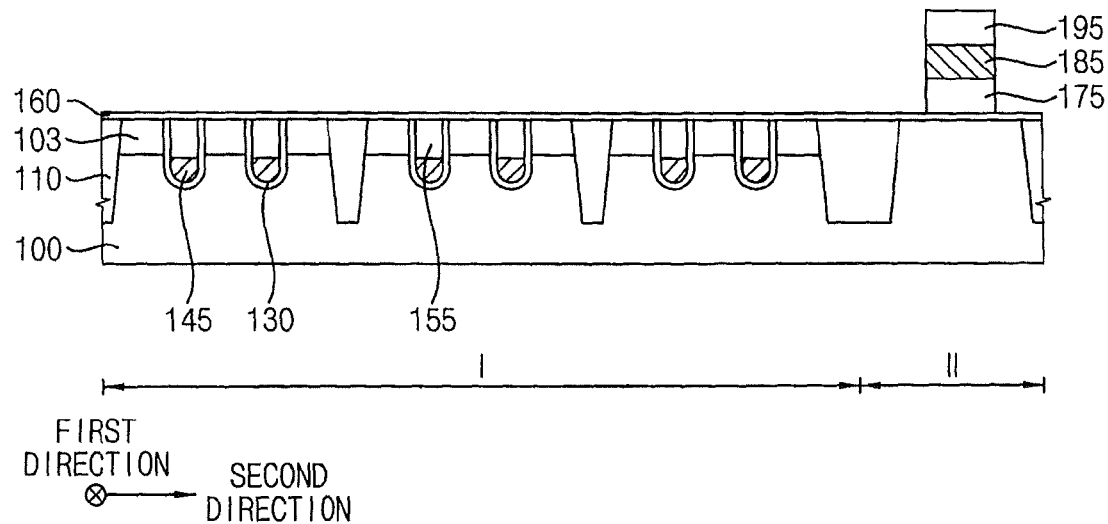
Figure 10:
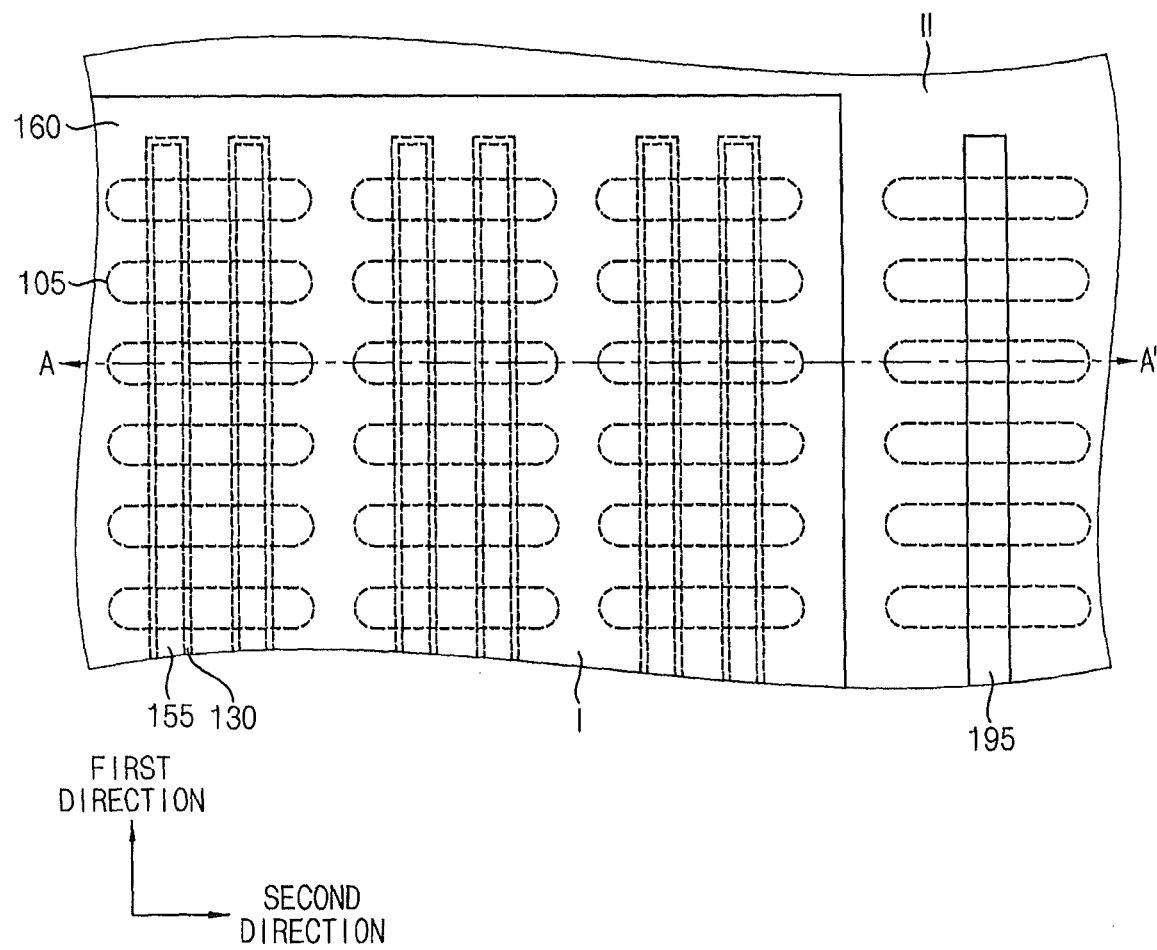

Referring to FIGS. 9 and 10, the second mask layer 190 may be patterned by a photolithography process to form a second mask 195 in the second region II, and the third and second gate electrode layers 180 and 170 may be etched using the second mask 195 as an etching mask to form a third gate electrode 185 and a second gate electrode 175, respectively, in the second region II.

When the second and third gate electrodes 175 and 185 are formed, in example embodiments, the second gate insulation layer 160 may not be patterned but may remain on the substrate 100, the isolation layer 110 and the first gate structures. Alternatively, the second gate insulation layer 160 may be patterned together with the second and third gate electrode layers 170 and 180 to be removed from the first region I of the substrate 100.

The second gate insulation layer 160, the second gate electrode 175, the third gate electrode 185 and the second mask 195 on the substrate 100 in the second region II may form a second gate structure, and the second and third gate electrodes 175 and 185 and the second mask 195 may be referred to as a second gate electrode structure.

Figure 11:
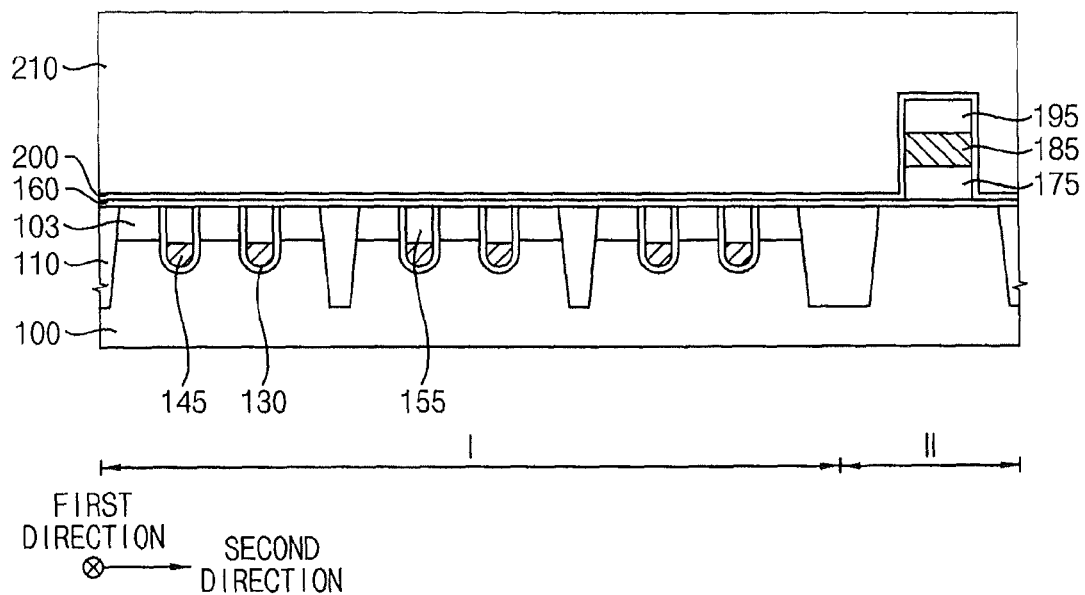

Referring to FIG. 11, an etch stop layer 200 may be formed on the second gate insulation layer 160 and the second gate electrode structure, and a first insulating interlayer 210 may be formed on the etch stop layer 200 to have a top surface that is higher above the substrate 100 than is the second gate electrode structure so that the first insulating interlayer 210 may cover the second gate electrode structure.

The etch stop layer 200 may include, e.g., silicon nitride, and the first insulating interlayer 210 may include, e.g., silicon oxide. Thus, the etch stop layer 200 may include a material that is substantially the same as the material of the second mask 195, thereby to be merged thereto.

A portion of the first insulating interlayer 210 in the first region I may be removed in subsequent processes, and thus may serve as a sacrificial layer.

Figure 12:
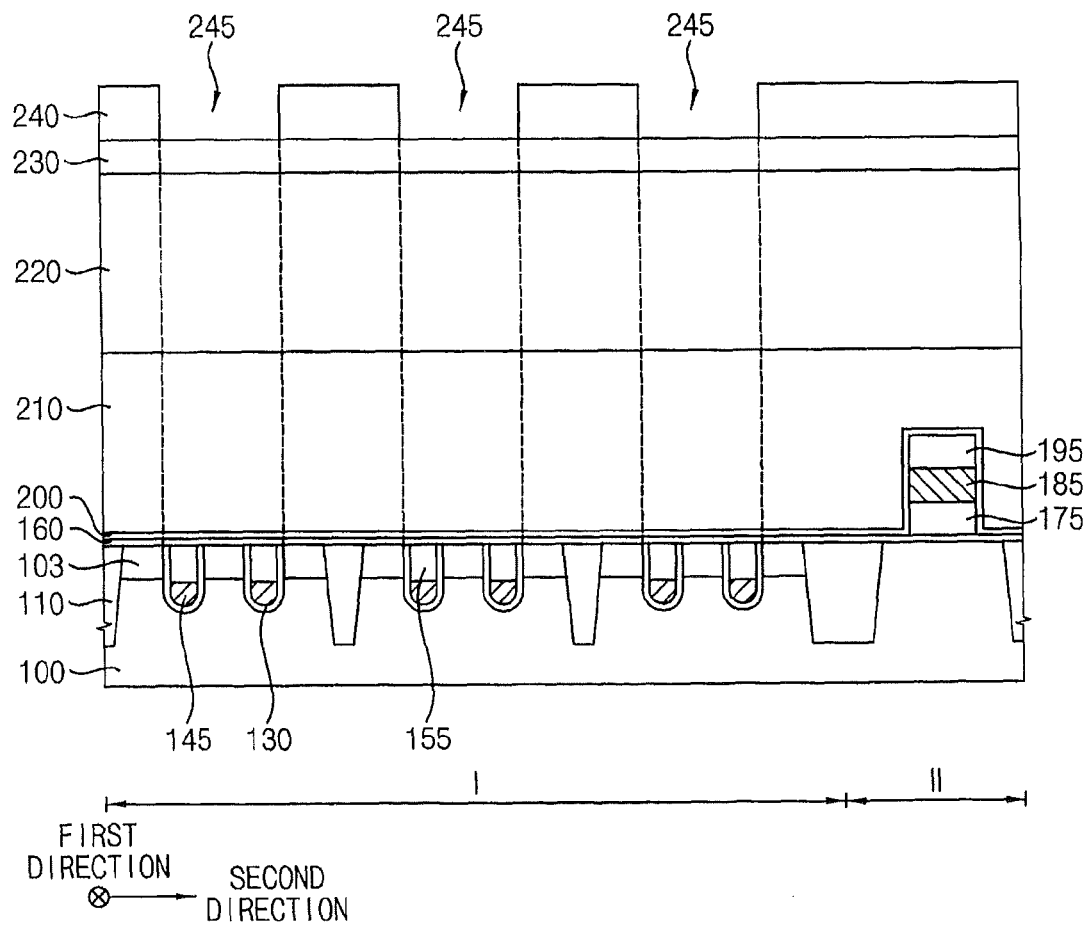
Figure 13:
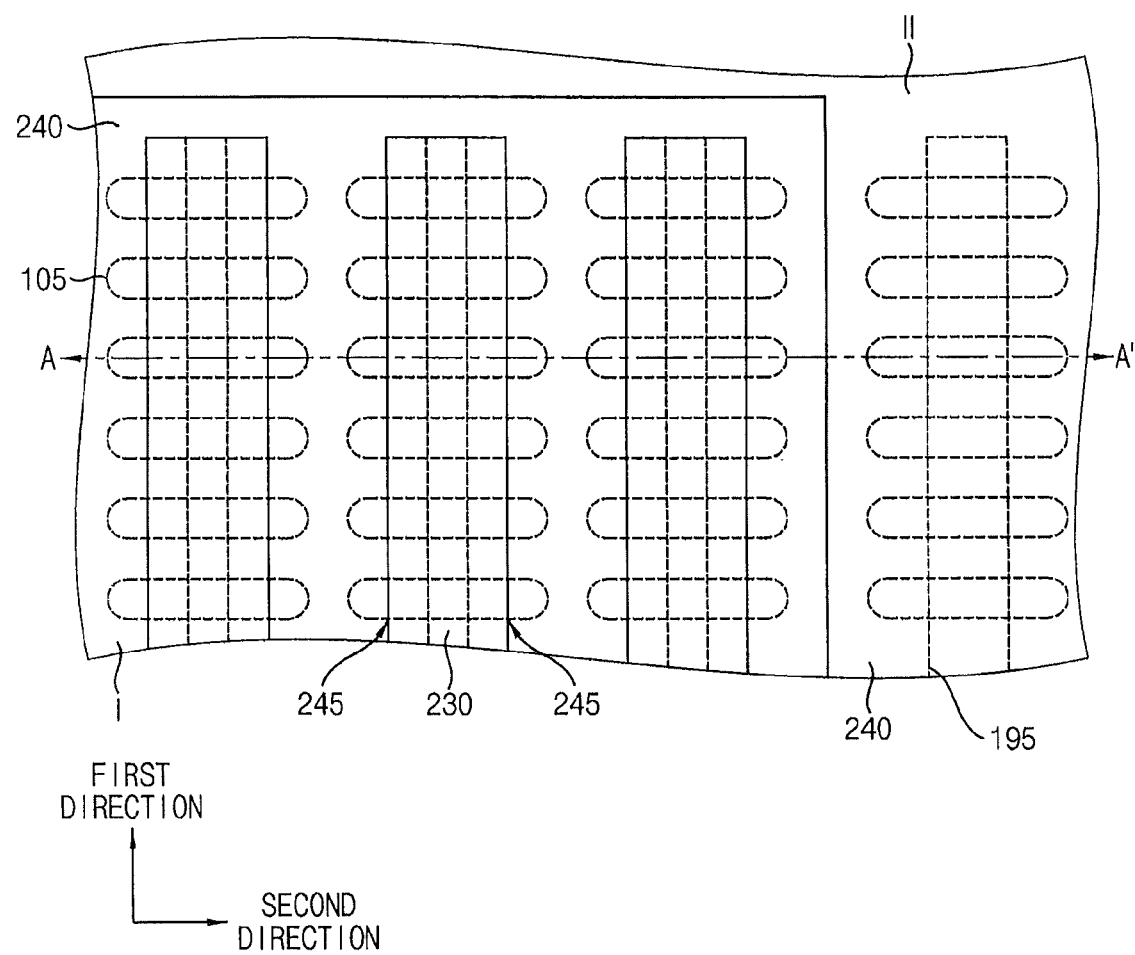

Referring to FIGS. 12 and 13, a silicon-on-hardmask (SOH) layer 220, an oxynitride layer 230 and a first photoresist pattern 240 may be sequentially formed on the first insulating interlayer 210.

The first photoresist pattern 240 may include a plurality of first openings 245. Each first opening 245 may extend in the first direction, and the openings 245 may be spaced apart from each other in the second direction. In example embodiments, each first opening 245 may overlie two adjacent first gate structures that are formed in a common active region 105 and a portion of the substrate 100 therebetween.

Figure 14:
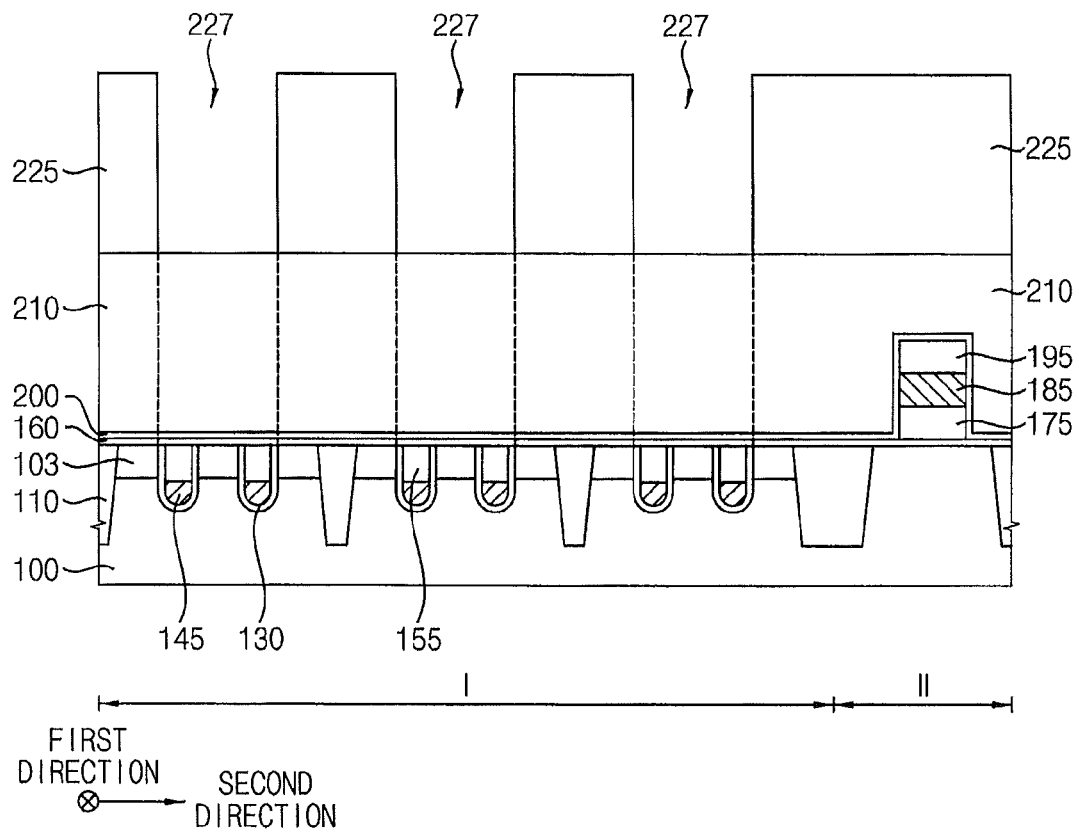

Referring to FIG. 14, the oxynitride layer 230 may be etched using the first photoresist pattern 240 as an etching mask to form an oxynitride layer pattern (not shown), and the SOH layer 220 may be etched using the oxynitride layer pattern as an etching mask to form an SOH layer pattern 225. The SOH layer pattern 225 may include a plurality of second openings 227 that expose top surfaces of the first insulating interlayer 210.

Each second opening 227 may have a width in the second direction that is wider than the width of the first gate structure. For example, the width of each second opening 227 in the second direction may be about 2.5 times to about 3 times the width of the first gate structures. Additionally, a portion of the SOH layer pattern 225 between the second openings 227 may have a width in the second direction that is wider than the width of the first gate structures. For example, the width of the portion of the SOH layer pattern 225 between the second openings 227 may be about 2.5 times to about 4 times the width of the first gate structures. Thus, the portion of the SOH layer pattern 225 between the second openings 227 may not have a high aspect ratio, and thus may not collapse. A subsequent etching process (refer to FIGS. 15 and 16) may be performed using the SOH layer pattern 225 as an etching mask.

Figure 15:
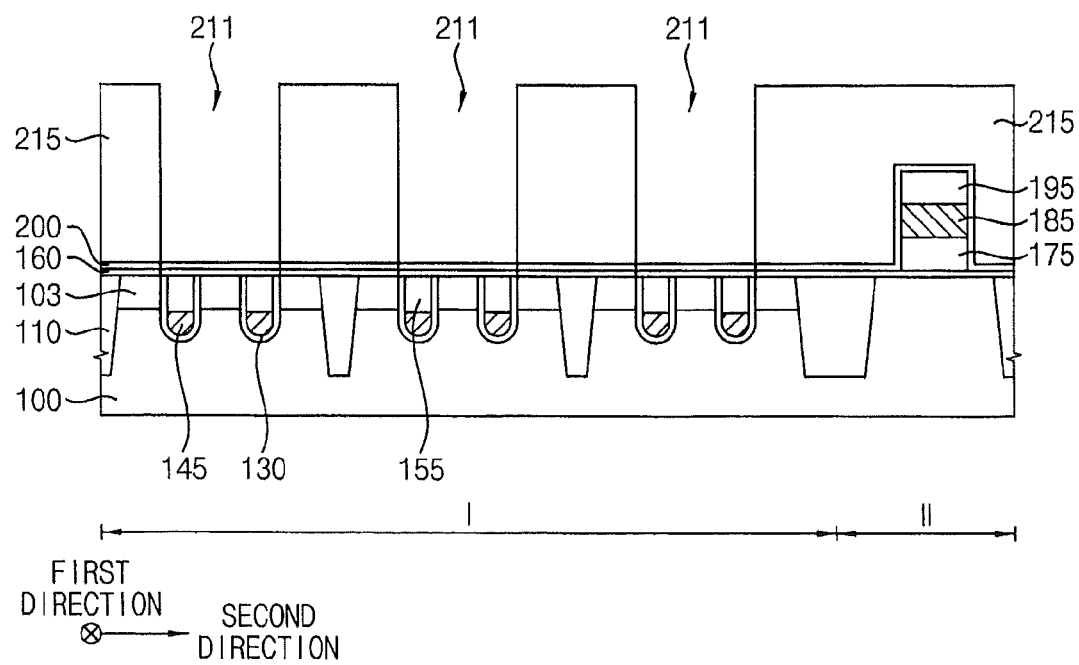
Figure 16:
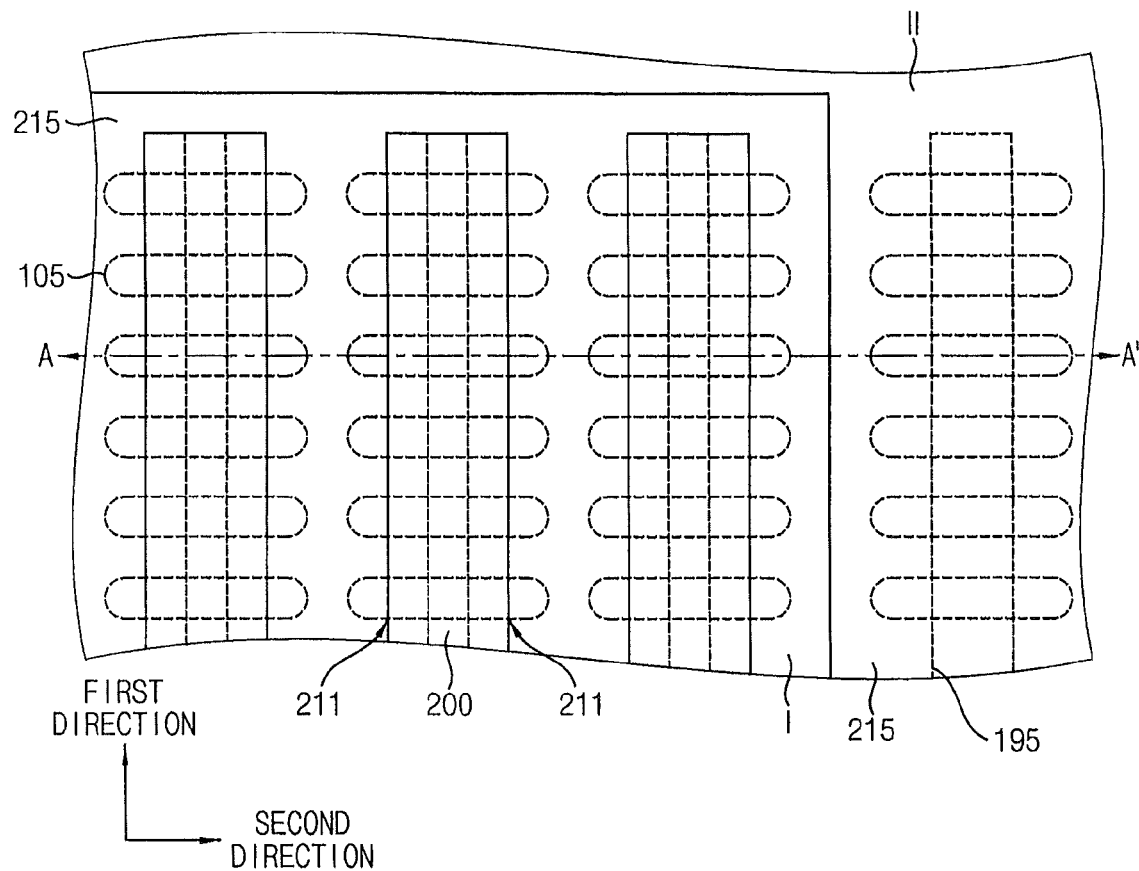

Referring to FIGS. 15 and 16, the first insulating interlayer 210 may be etched using the SOH layer pattern 225 as an etching mask to form a first insulating interlayer pattern 215.

The etching process may be performed using the etch stop layer 200 under the first insulating interlayer 210 as an etching end point. Thus, a plurality of third openings 211 may be formed through the first insulating interlayer pattern 215 that expose top surfaces of the etch stop layer 200. In example embodiments, each third opening 211 may overlie two adjacent first gate structures that are formed in a common active region 105 and the portion of the substrate 100 therebetween.

As described above, the portion of the first insulating interlayer pattern 215 in the first region I may be removed in a subsequent process (refer to FIGS. 19 and 20), and thus may be referred to as a sacrificial layer pattern 215 hereinafter.

Figure 17:
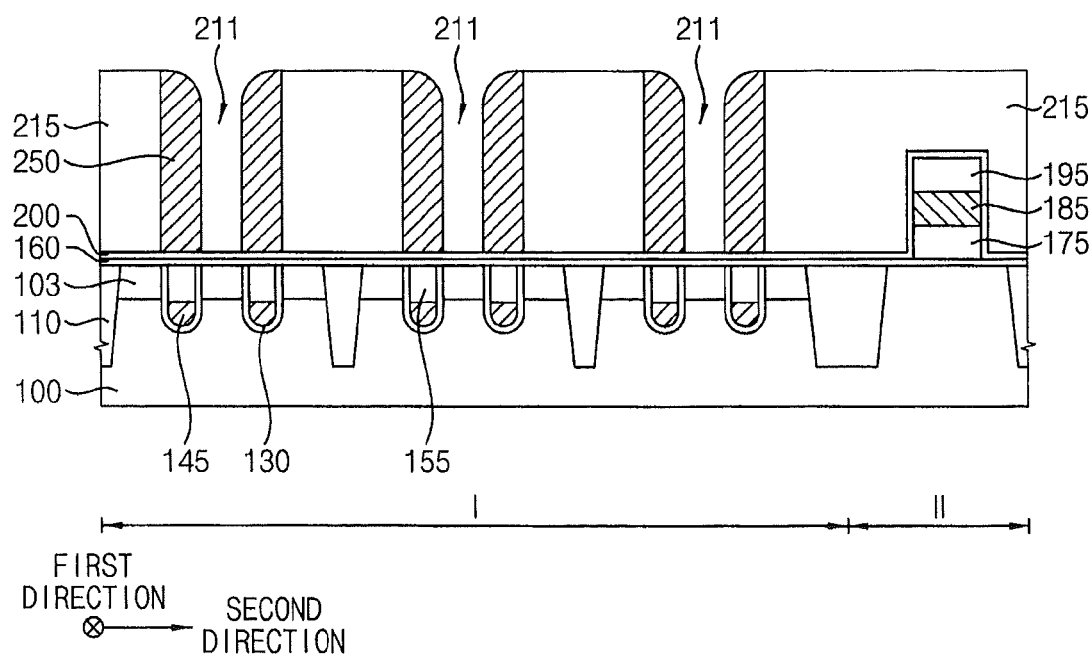
Figure 18:
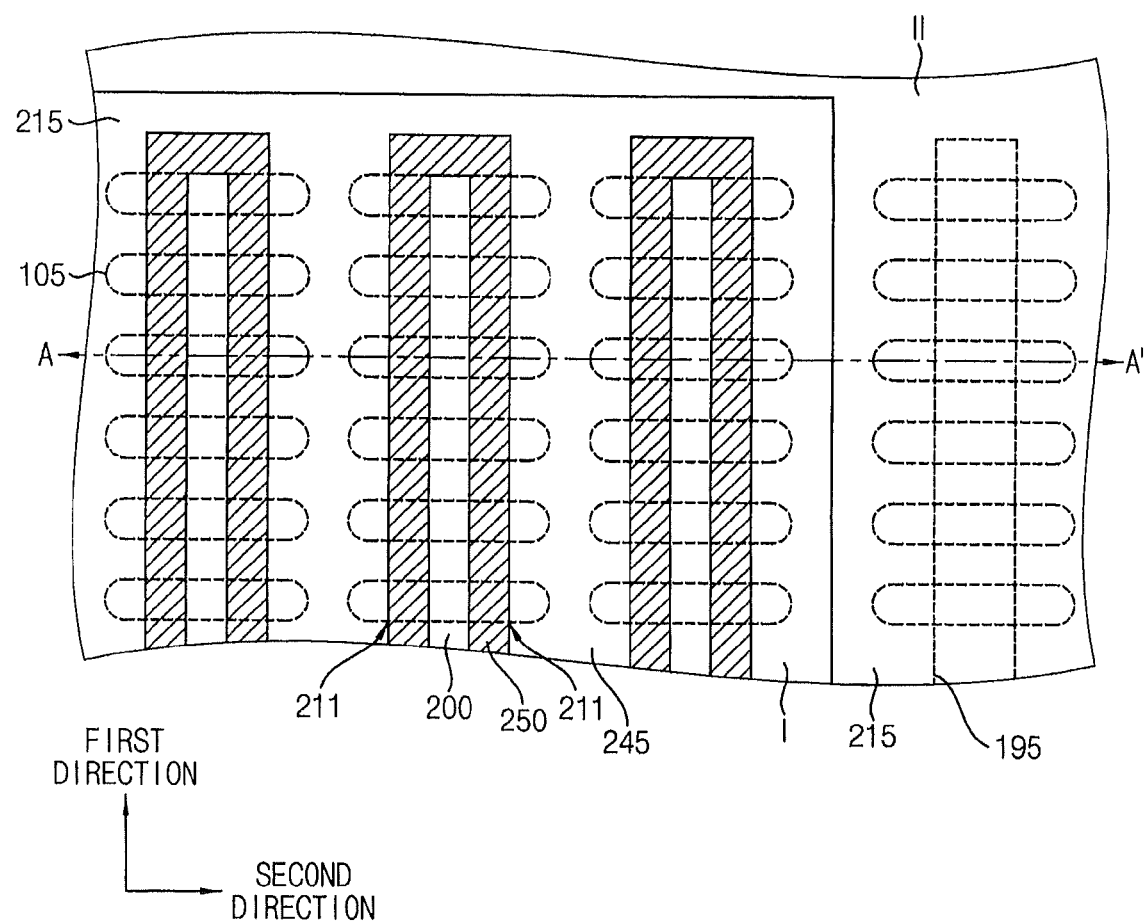

Referring to FIGS. 17 and 18, a first spacer 250 may be formed on a sidewall of each third opening 211.

The first spacers 250 may be formed by forming a first spacer layer on the sidewalls of the third openings 211, the exposed top surfaces of the etch stop layer 200 and the sacrificial layer pattern 215, and by then anisotropically etching the first spacer layer.

The first spacer layer may include, e.g., silicon nitride, and may be formed by, for example, an ALD process.

In example embodiments, each first spacer 250 may overlie a respective first gate structure. Portions of each first spacer 250 opposite to each other in each third opening 211 may be spaced apart from each other by a first distance in the second direction. In an example embodiment, the first distance may be similar to the width of the first gate structure in the second direction.

As shown in FIG. 18, when viewed from above, each third opening 211 may include one first spacer 250. Each first spacer 250 may form a rectangular loop within its respective third opening 211. Accordingly, each first spacer 250 may have two first portions, each of which extend in the first direction, and two second portions that each extend in the second direction and connect the two first portions to form the rectangular loop. Hereinafter, the two first portions of the first spacer 250 may be referred to as if they are two separate and independent first spacers 250. Thus, the two first spacers 250 may be spaced apart from each other by the first distance in the second direction in each third opening 211.

Figure 19:
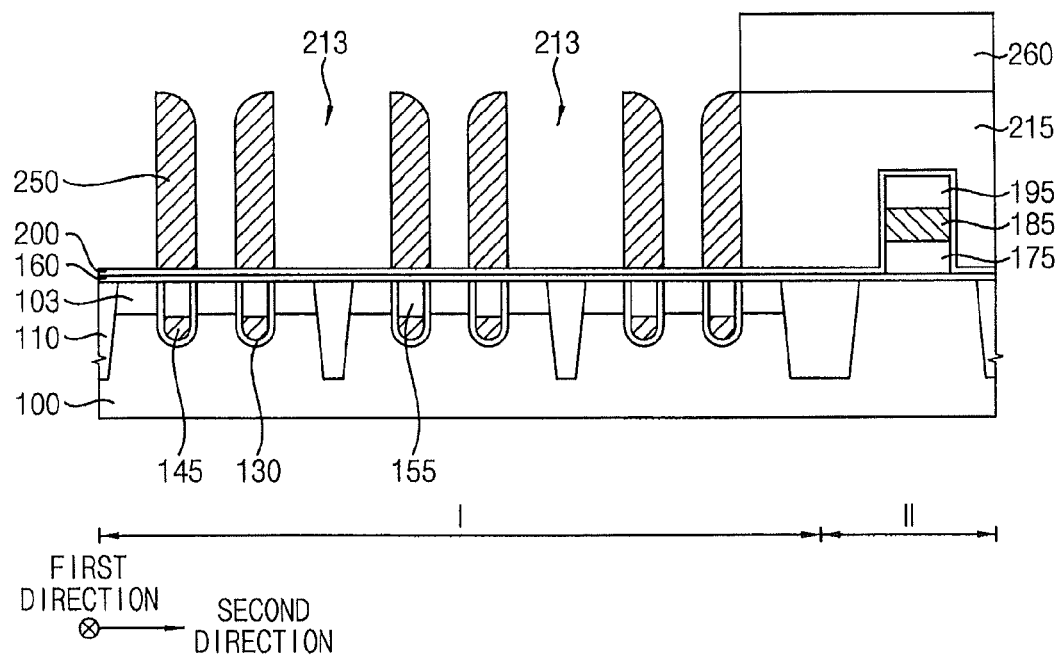
Figure 20:
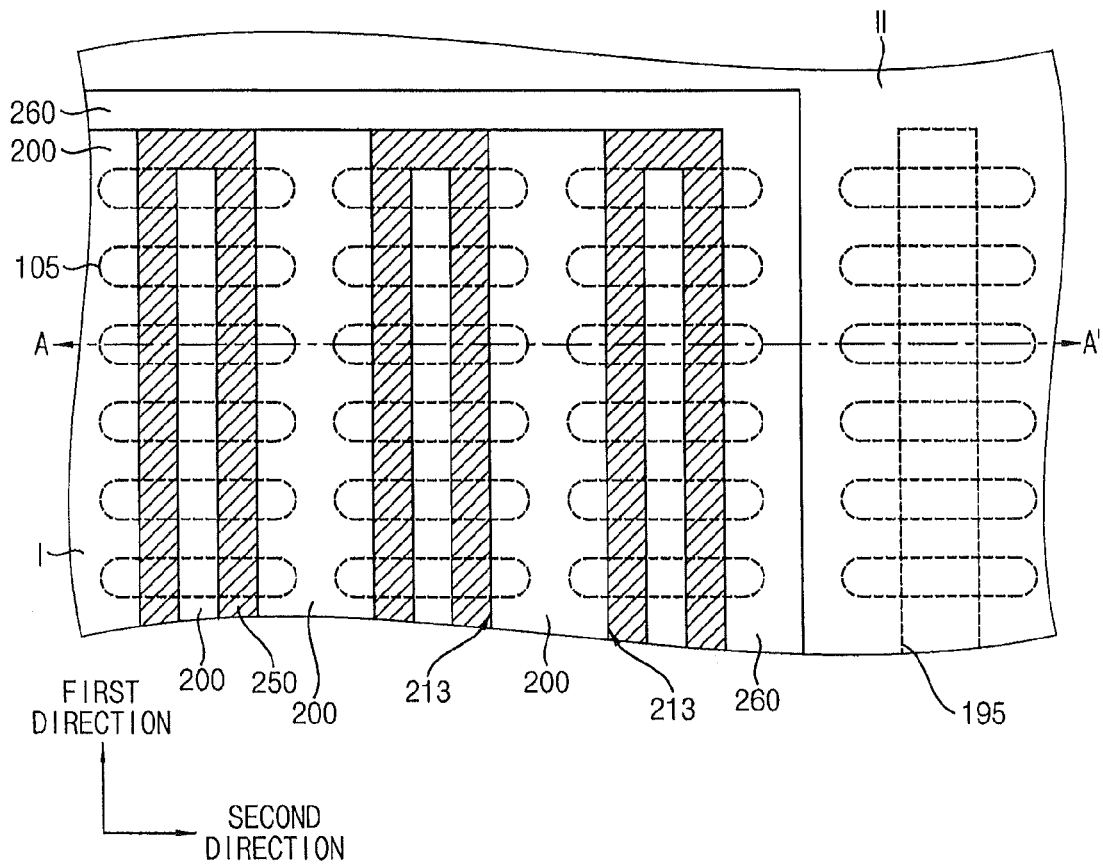

Referring to FIGS. 19 and 20, a third mask 260 may be formed on the sacrificial layer pattern 215, and a portion of the sacrificial layer pattern 215 that is not covered by the third mask 260 may be removed to form a plurality of fourth openings 213 that expose top surfaces of the etch stop layer 200.

In example embodiments, the third mask 260 may be formed to cover the entire portion of the sacrificial layer pattern 215 in the second region II and a portion of the sacrificial layer pattern 215 in the first region I that is adjacent to the second region II, and may expose a central portion of the sacrificial layer pattern 215 in the first region I. In an example embodiment, the third mask 260 may be formed to cover the second region II and portions of the sacrificial layer pattern 215 in the first region I that are outside of outermost ones of the first spacers 250.

In example embodiments, the portion of the sacrificial layer pattern 215 that is not covered by the third mask 260 may be removed by a wet etching process using hydrofluoric acid as an etching solution.

The fourth openings may extend a second distance in the second direction. The second distance may correspond to a width of the sacrificial layer pattern 215 in the second direction. Thus, the first spacers 250 that are on adjacent active regions 105 may be spaced apart from each other by the second distance through the fourth opening 213. In an example embodiment, the second distance may be about 2.5 times to about 4 times the width of the first gate structures in the second direction, and thus may be larger than the first distance.

As a result, adjacent first spacers 250 may be spaced apart from one another by either the first distance or the second distance in the second direction. Particularly, viewed from right to left in FIG. 26, when counting from the outermost (right-most) one of the first spacers 250, a distance from odd numbered first spacers 250 to neighboring even numbered first spacers 250 may be the first distance, and a distance from the even numbered first spacers 250 to the neighboring odd numbered first spacers 250 may be the second distance.

Figure 21:
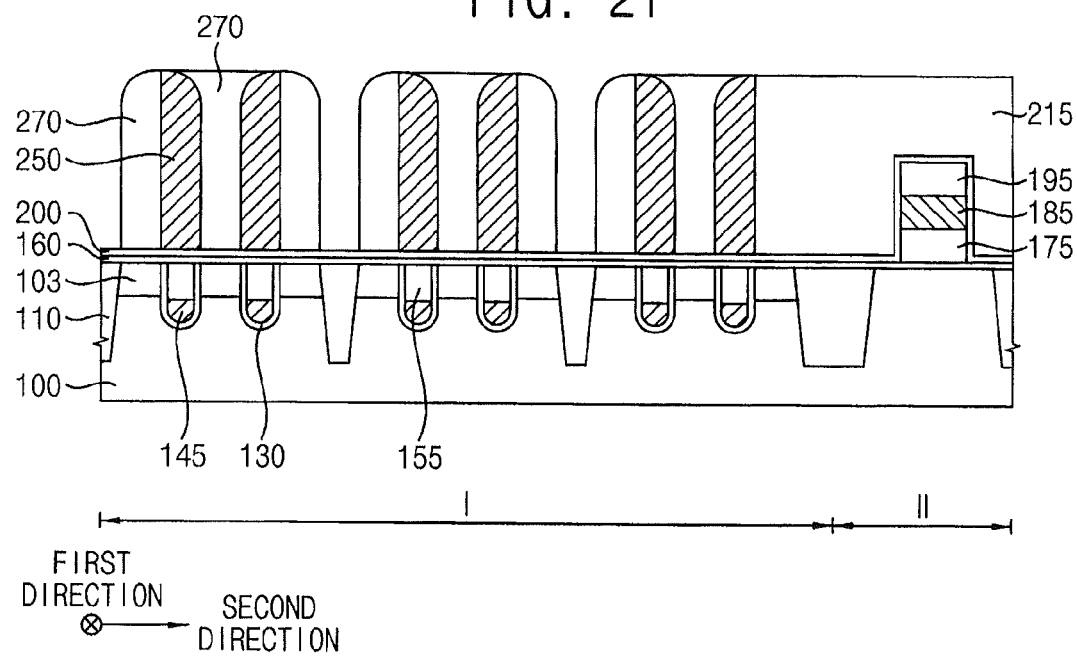
Figure 22:
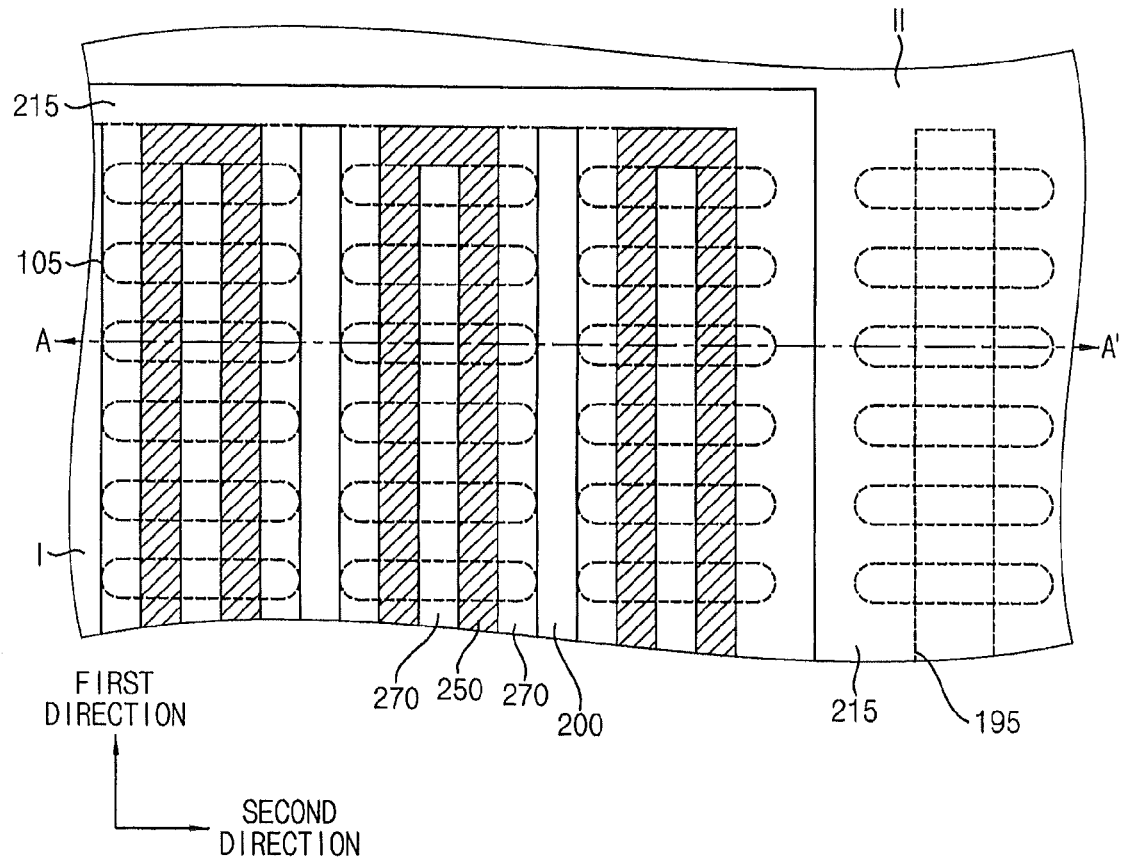

Referring to FIGS. 21 and 22, after removing the third mask 260, second spacers 270 that contact the first spacers 250 may be formed on the substrate 100.

In example embodiments, the second spacers 270 may be formed by forming a second spacer layer on the first spacers 250, the etch stop layer 200 and the sacrificial layer pattern 215, and then anisotropically etching the second spacer layer.

The second spacer layer may include, e.g., silicon oxide, and thus a portion of the second spacer layer contacting the sacrificial layer pattern 215 may be merged thereto. In example embodiments, the second spacer layer may be formed by an ALD process.

In example embodiments, the second spacer layer may fill the openings between the first spacers 250 that are spaced apart from each other by the first distance, and may partially fill the openings and partially cover a portion of the etch stop layer 200 between the first spacers 250 that are spaced apart from each other by the second distance.

Figure 23:
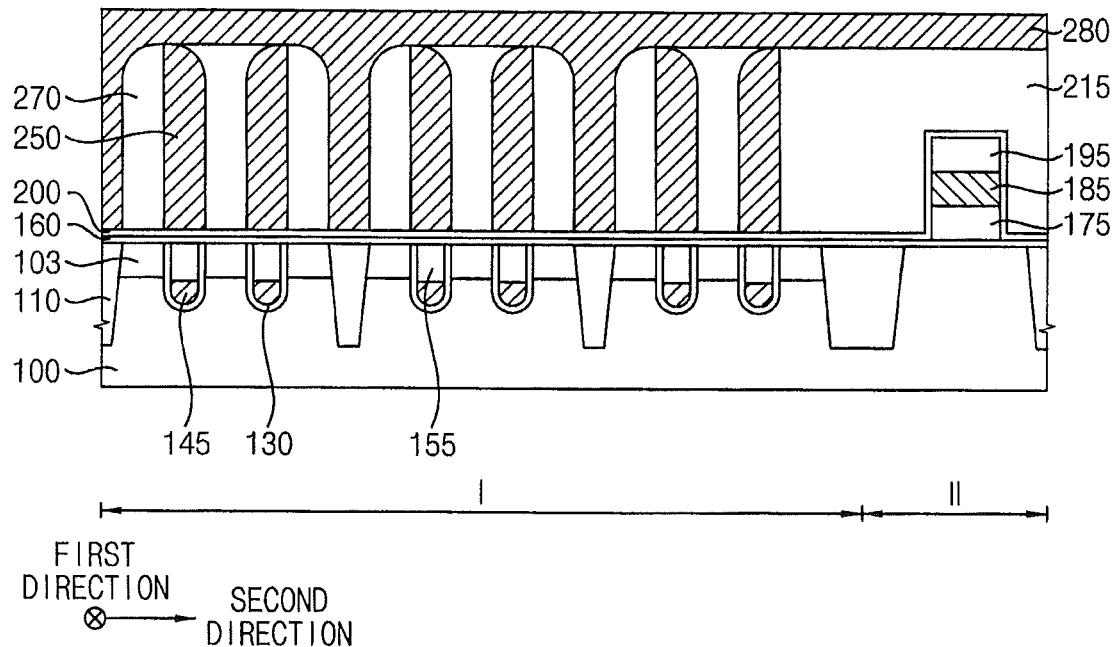

Referring to FIG. 23, a filling layer 280 may be formed on the etch stop layer 200, the first and second spacers 250 and 270 and the sacrificial layer pattern 215 to sufficiently fill the openings between the second spacers 270, i.e., the remaining portions of the fourth openings 213.

In example embodiments, the filling layer 280 may be formed to include a material substantially the same as that of the first spacers 250, e.g., silicon nitride. The filling layer 280 may be formed by, for example, an ALD process or a CVD process.

Figure 24:
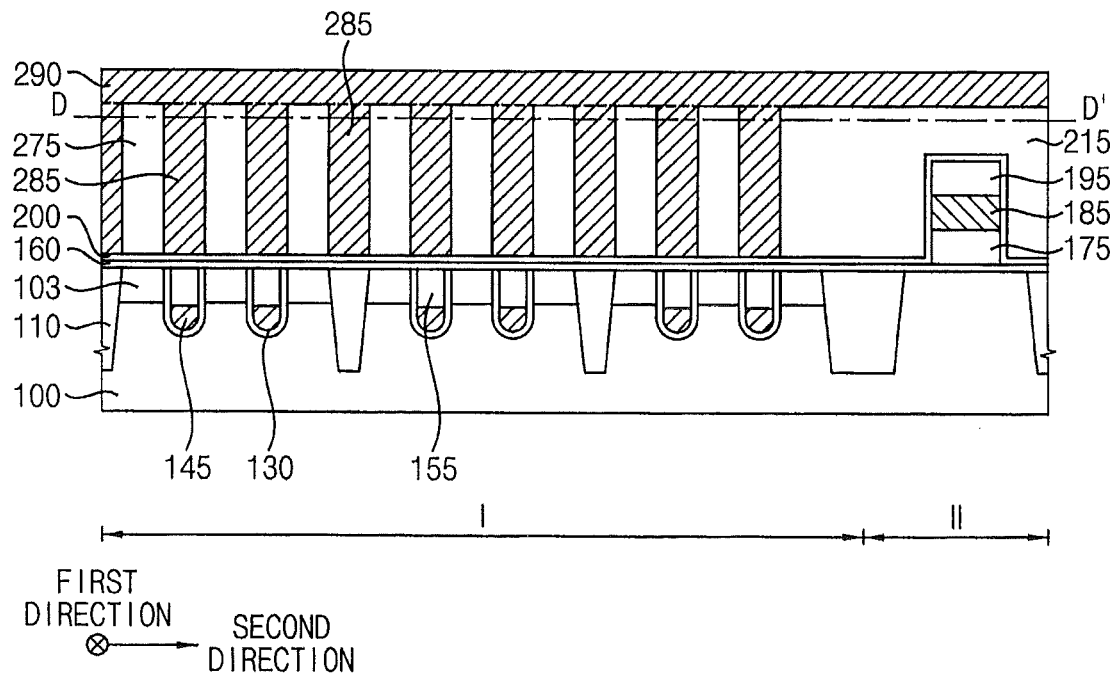
Figure 25:
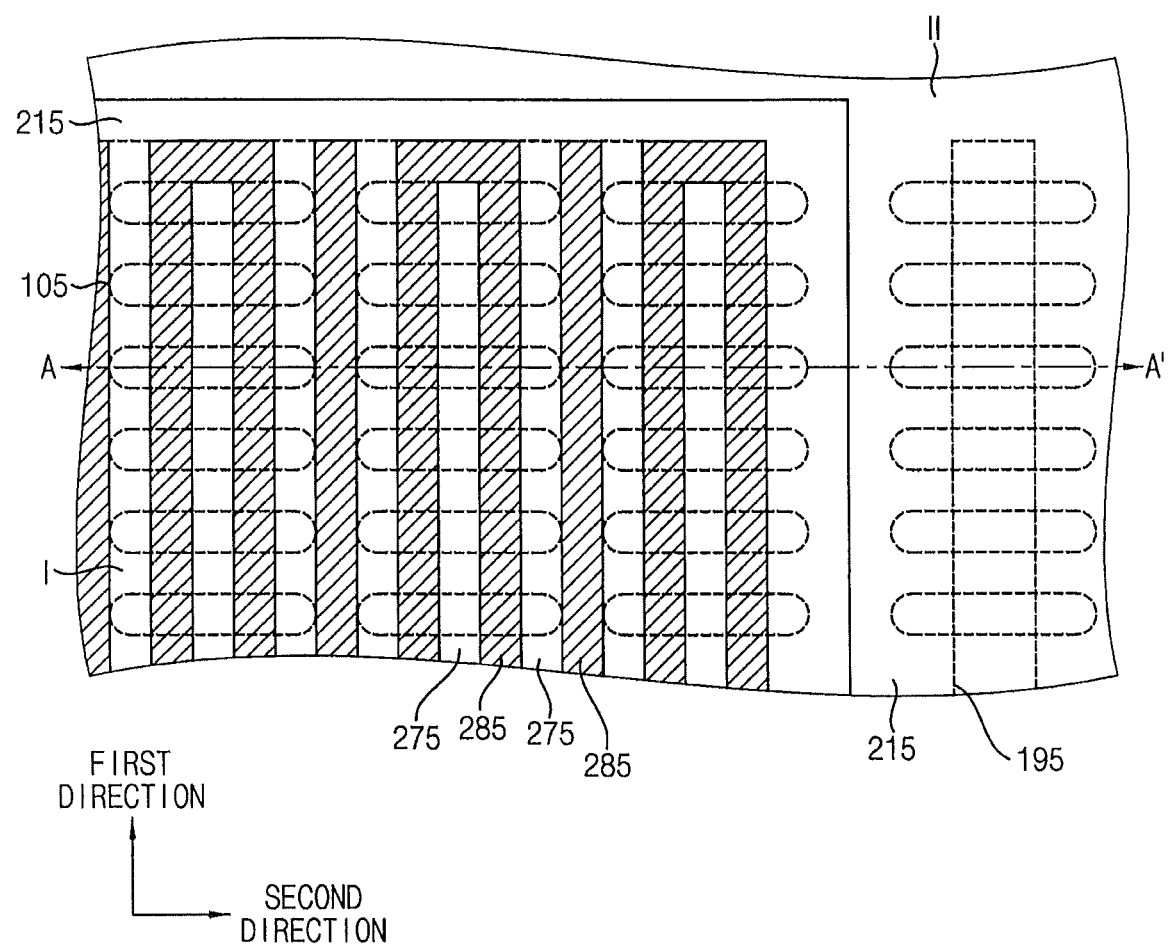
FIGS. 25 and 31 are horizontal cross-sectional views of the MRAM device according to embodiments of the inventive concept.

Referring to FIGS. 24 and 25, upper portions of the filling layer 280, the first and second spacers 250 and 270 and the sacrificial layer pattern 215 may be planarized to form first and second patterns 285 and 275, and a second capping layer 290 may be formed on the first and second patterns 285 and 275 and the sacrificial layer pattern 215.

In example embodiments, the planarization process may be performed by a CMP process and/or by an etch back process.

By the planarization process, the first spacers 250 and the filling layer 280 may be converted into the first patterns 285, and the second spacers 270 may be converted into the second patterns 275. Thus, each of the first and second patterns 285 and 275 may extend in the first direction, and the first and second patterns 285 and 275 may be alternately and repeatedly formed in the second direction. In example embodiments, some of the first patterns 285 may overlie the first gate structures, and the others of the first patterns 285 may overlie the isolation layer 110. In example embodiments, the second patterns 275 may overlie the impurity regions 103 adjacent to the first gate structures.

The first patterns 285 may include, e.g., silicon nitride, and the second patterns 275 may include, e.g., silicon oxide. The second capping layer 290 may include, e.g., silicon nitride, and thereby merge into the first patterns 285.

Figure 26:
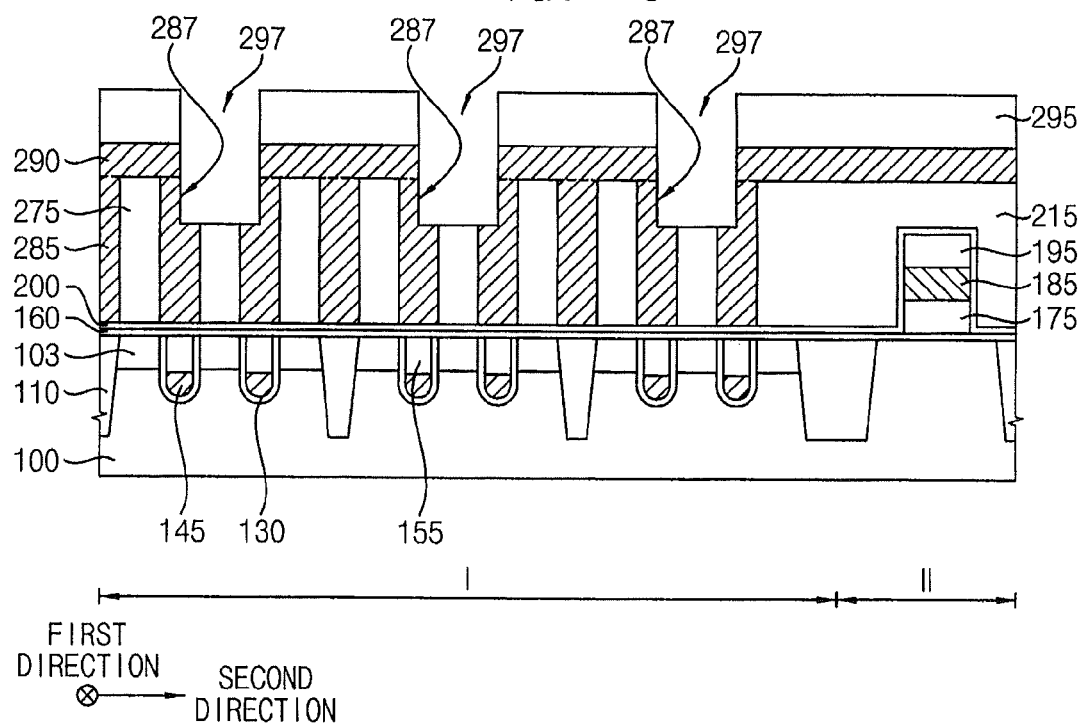
Figure 27:
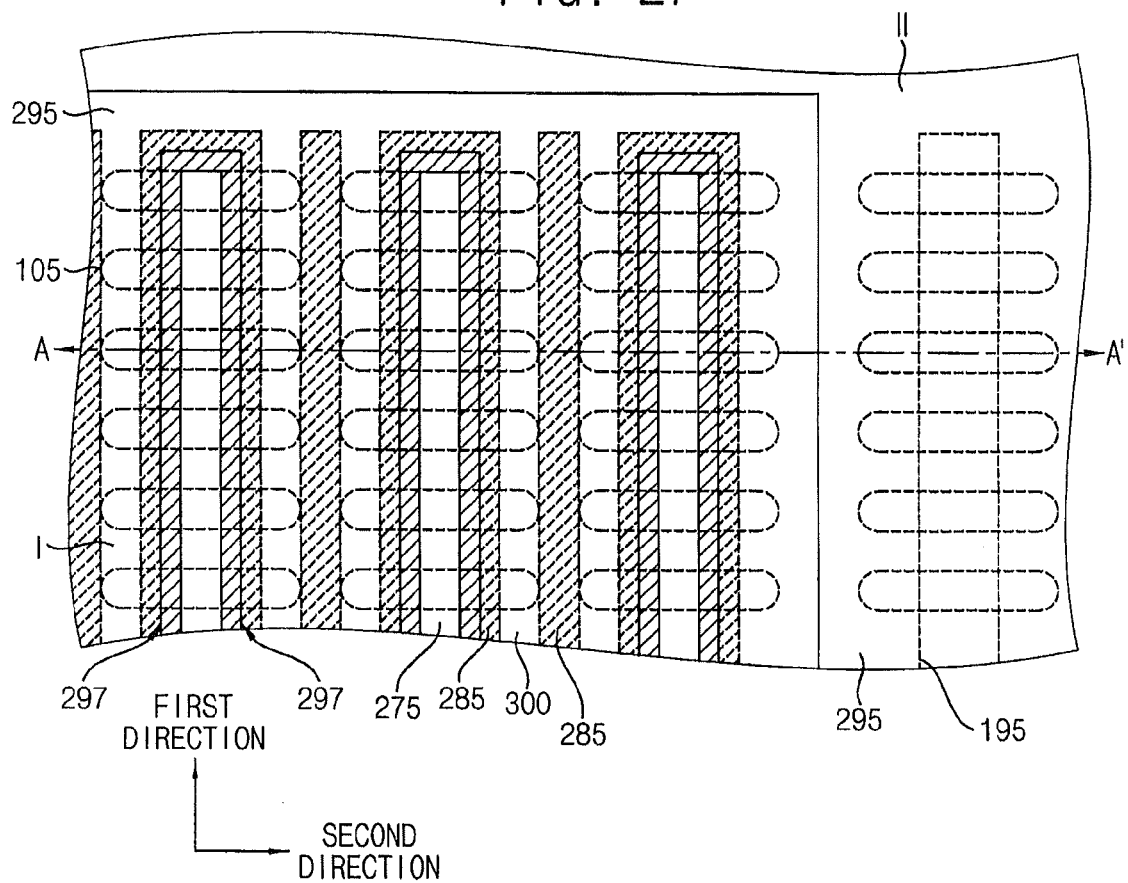

Referring to FIGS. 26 and 27, a second photoresist pattern 295 may be formed on the second capping layer 290, and the second capping layer 290 and upper portions of the first and second patterns 285 and 275 may be etched using the second photoresist pattern 295 as an etching mask to form recesses 287.

In example embodiments, the second photoresist pattern 295 may include a plurality of fifth openings 297, each of which may extend in the first direction. The fifth openings 297 are spaced apart from each other in the second direction. Each fifth opening 297 may overlie a respective one of the second patterns 275 that are on a portion of the substrate 100 that is between the adjacent first gate structures in a common active region 105, as well as portions of the first patterns 285 that are adjacent to this second pattern 275. Thus, (3n−2)th second patterns 275, e.g., first, fourth and seventh second patterns 275 may be exposed by the recesses 287 when counted from an outermost one of the second patterns 275 (i.e., when counting from right to left in FIG. 26). Here, n indicates a positive integer. In example embodiments, the etching process may be a dry etching process.

Figure 28:
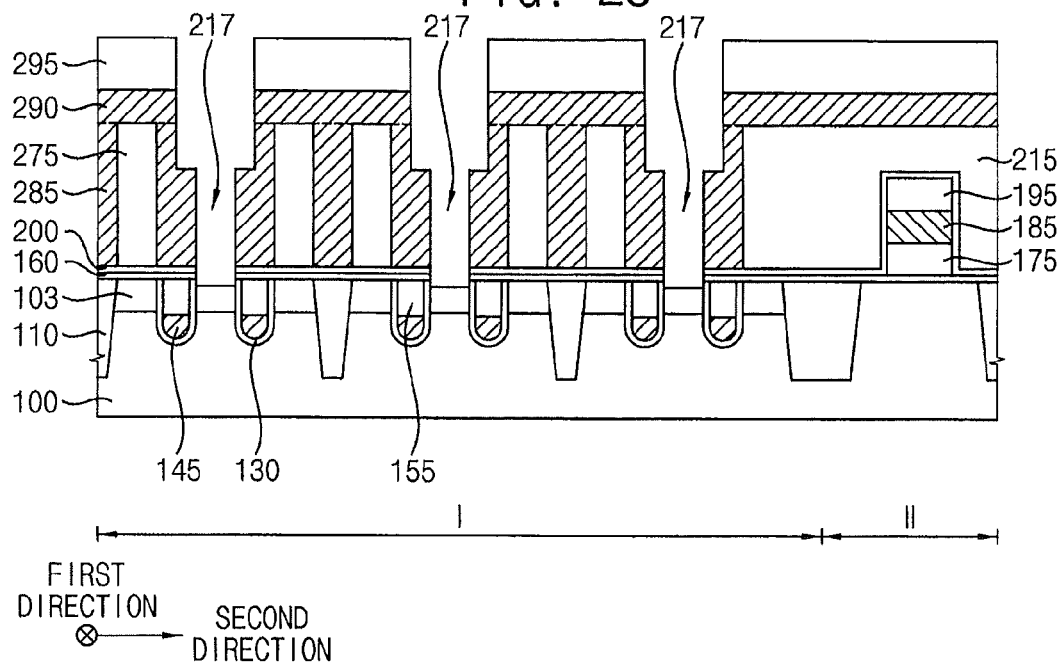
Figure 29:
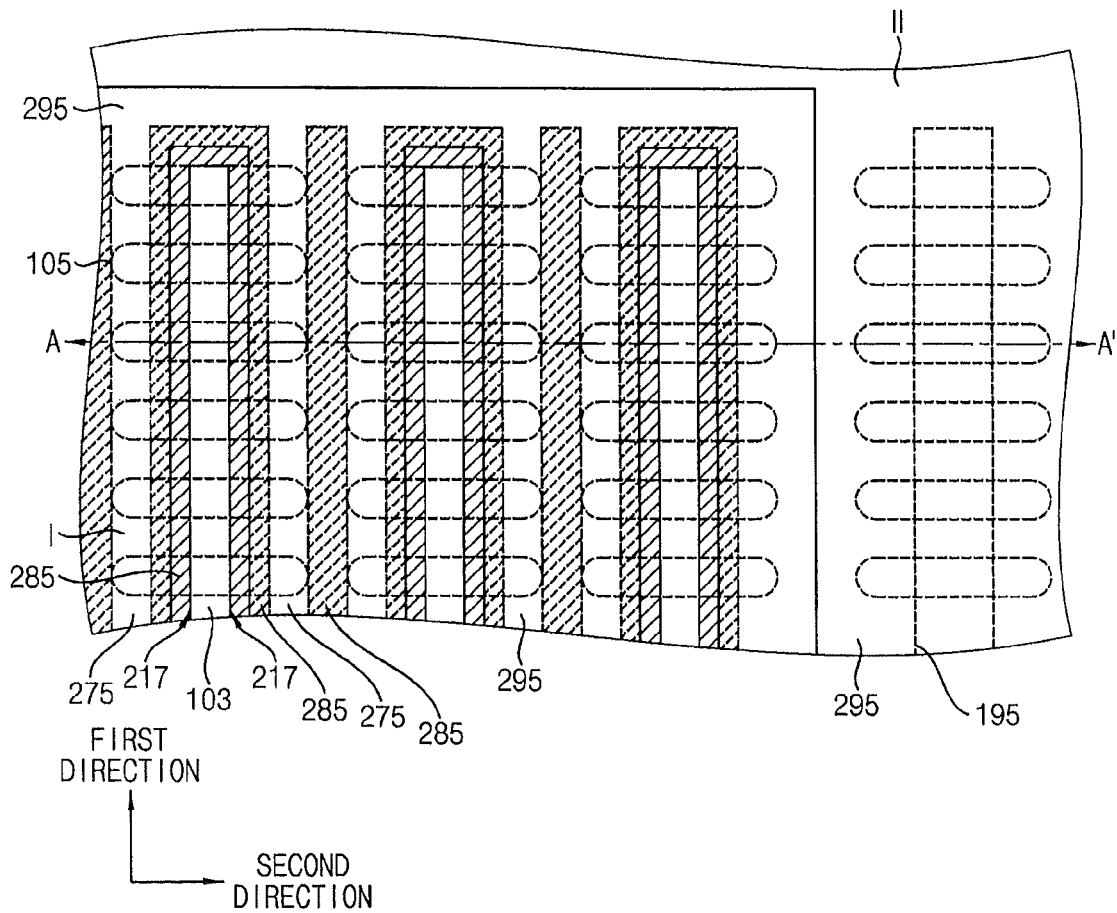

Referring to FIGS. 28 and 29, the second patterns 275 that are exposed by the recesses 287 may be removed, and portions of the etch stop layer 200 and the second gate insulation layer 160 thereunder may be removed to form sixth openings 217 that expose upper portions of the substrate 100 and that are in fluid communication with the respective recesses 287.

In example embodiments, the exposed second patterns 275 may be removed by a wet etching process using hydrofluoric acid as an etching solution, and the portions of the etch stop layer 200 and the second gate insulation layer 160 may be removed by a dry etching process.

Each sixth opening 217 may extend in the first direction, and the sixth openings 217 may be spaced apart from each other in the second direction.

Figure 30:
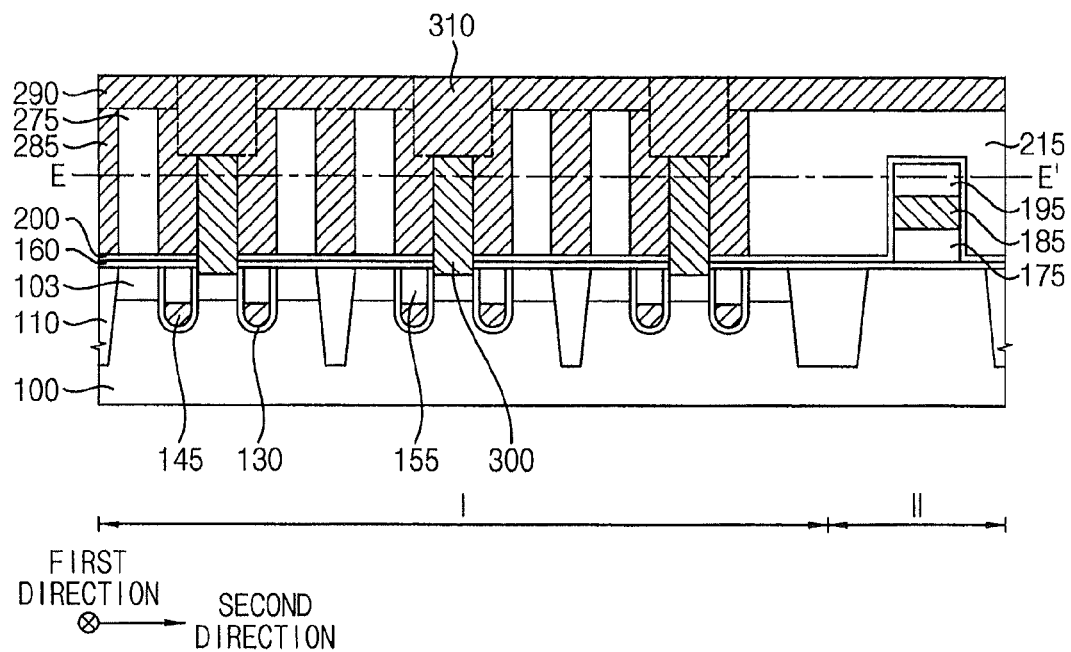
Figure 31:
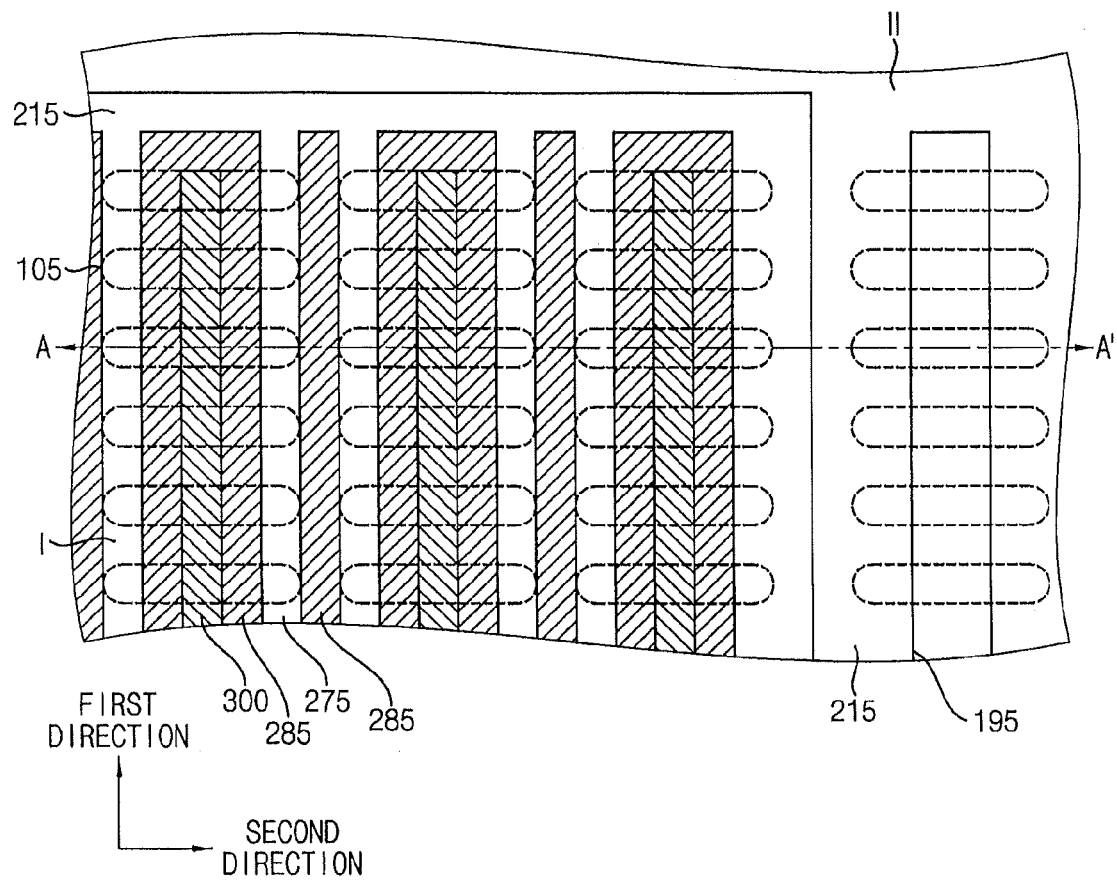

Referring to FIGS. 30 and 31, after removing the second photoresist pattern 295, source lines 300 may be formed that fill each sixth opening 217, and a third capping layer pattern 310 may be formed to fill each recess 287.

The source lines 300 may be formed by forming a first conductive layer on the exposed upper portions of the substrate 100 to fill the sixth openings 217 and the recesses 287, and then an upper portion of this first conductive layer may be removed. In example embodiments, portions of the first conductive layer in the recesses 287 may be completely removed so that each source line 300 may be formed to only fill a respective one of the sixth openings 217. Alternatively, the portions of the first conductive layer in the recesses 287 may be partially removed so that each source line 300 may be formed to fill each sixth opening 217 and a lower portion of each recess 287. The first conductive layer may include a metal, e.g., tungsten, titanium, tantalum, etc., and/or a metal nitride, e.g., tungsten nitride, titanium nitride, tantalum nitride, etc.

Each source line 300 may extend in the first direction, and the source lines 300 may be spaced apart from each other in the second direction. In example embodiments, each source line 300 may be formed on portions of the substrate 100 and the isolation layer 110 between neighboring first gate structures.

The third capping layer pattern 310 may be formed by forming a third capping layer on the source lines 300 and the second capping layer 290 to fill the recesses 287, and planarizing an upper portion of the third capping layer.

In example embodiments, the planarization process may be performed until a top surface of the second capping layer 290 is exposed. The third capping layer may include, e.g., silicon nitride, and thereby merge into the first patterns 285 and/or the second capping layer 290.

Figure 32:
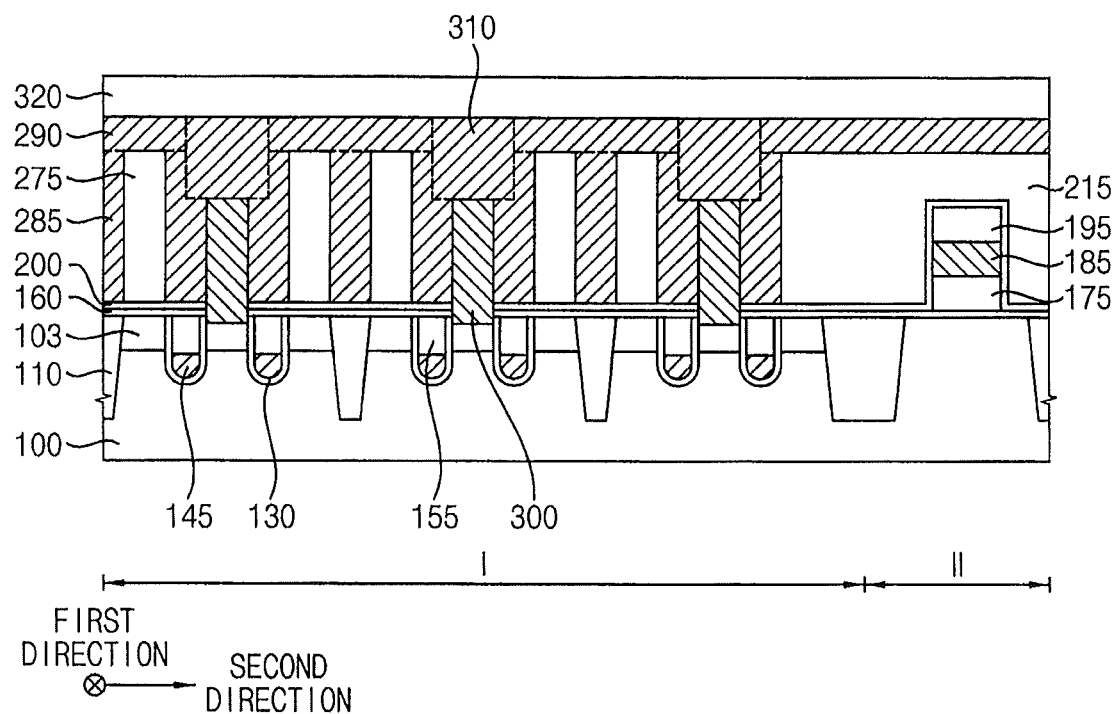
Figure 33:
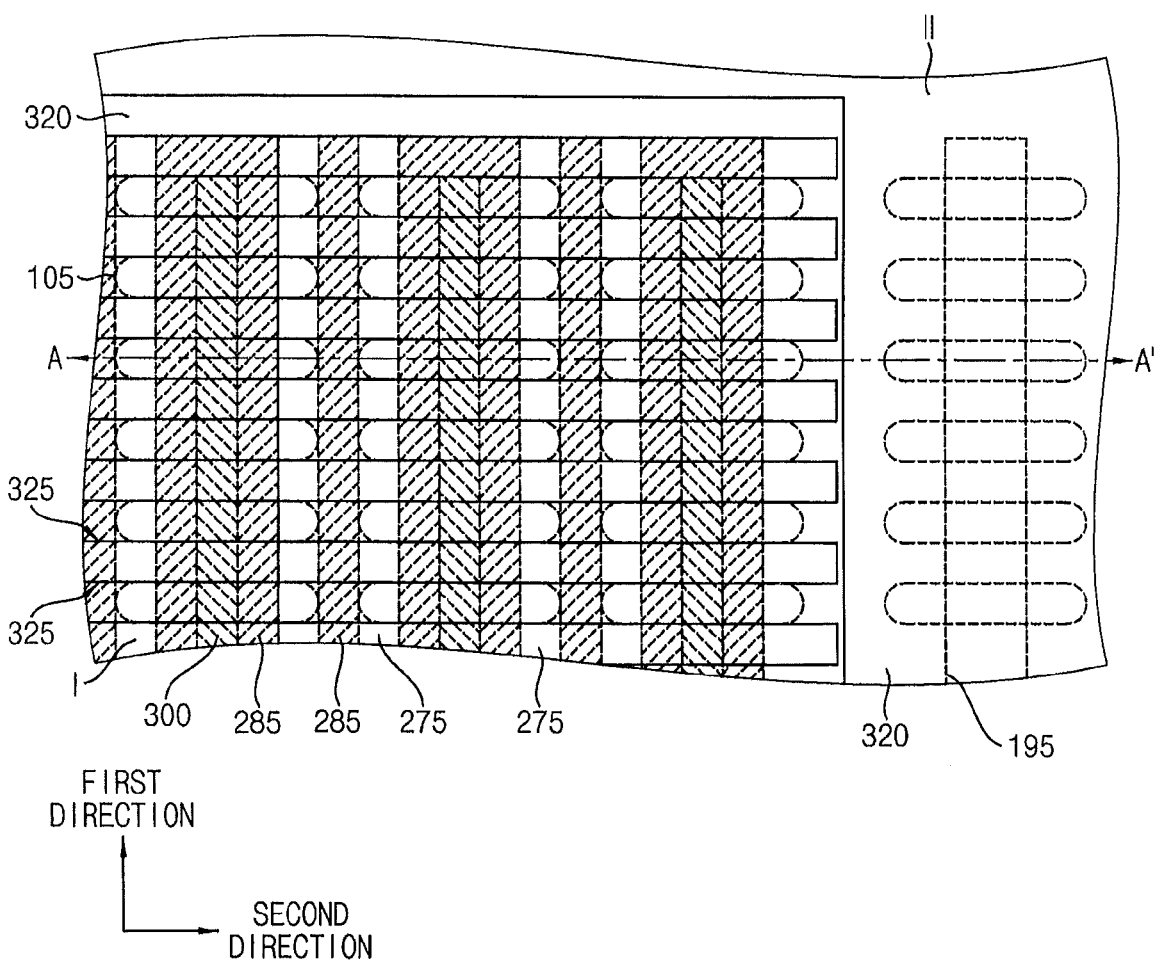

Referring to FIGS. 32 and 33, a fourth mask 320 may be formed on the second capping layer 290, the third capping layer pattern 310 and the sacrificial layer pattern 215.

In example embodiments, the fourth mask 320 may include a plurality of eighth openings 325 (see FIG. 33), each of which may extend in the second direction, that are spaced apart from each other in the first direction. Each eighth opening 325 may be formed in the first region I, and may partially expose the second capping layer 290, the third capping layer pattern 310 and the sacrificial layer pattern 215. In example embodiments, each eighth opening 325 may be formed to overlie the field region of the substrate 100, i.e., overlie the isolation layer 110.

In example embodiments, the fourth mask 320 having a fine width may be formed by double patterning technology (DPT). The fourth mask 320 may include a material having an etching selectivity with respect to both silicon nitride and silicon oxide, e.g., polysilicon.

Figure 34:
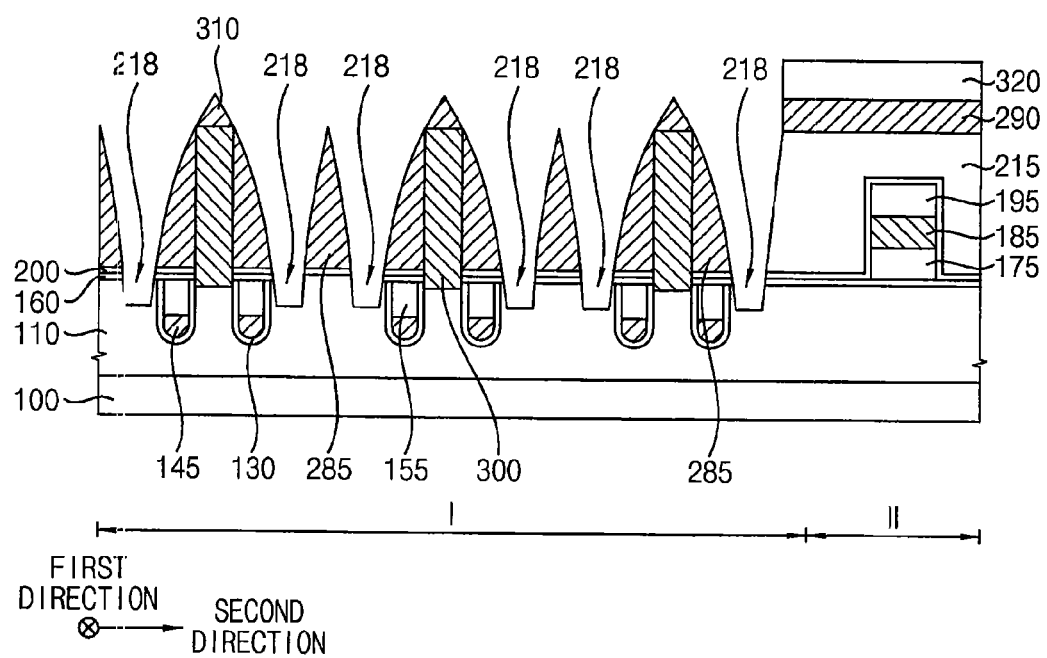
Figure 35:
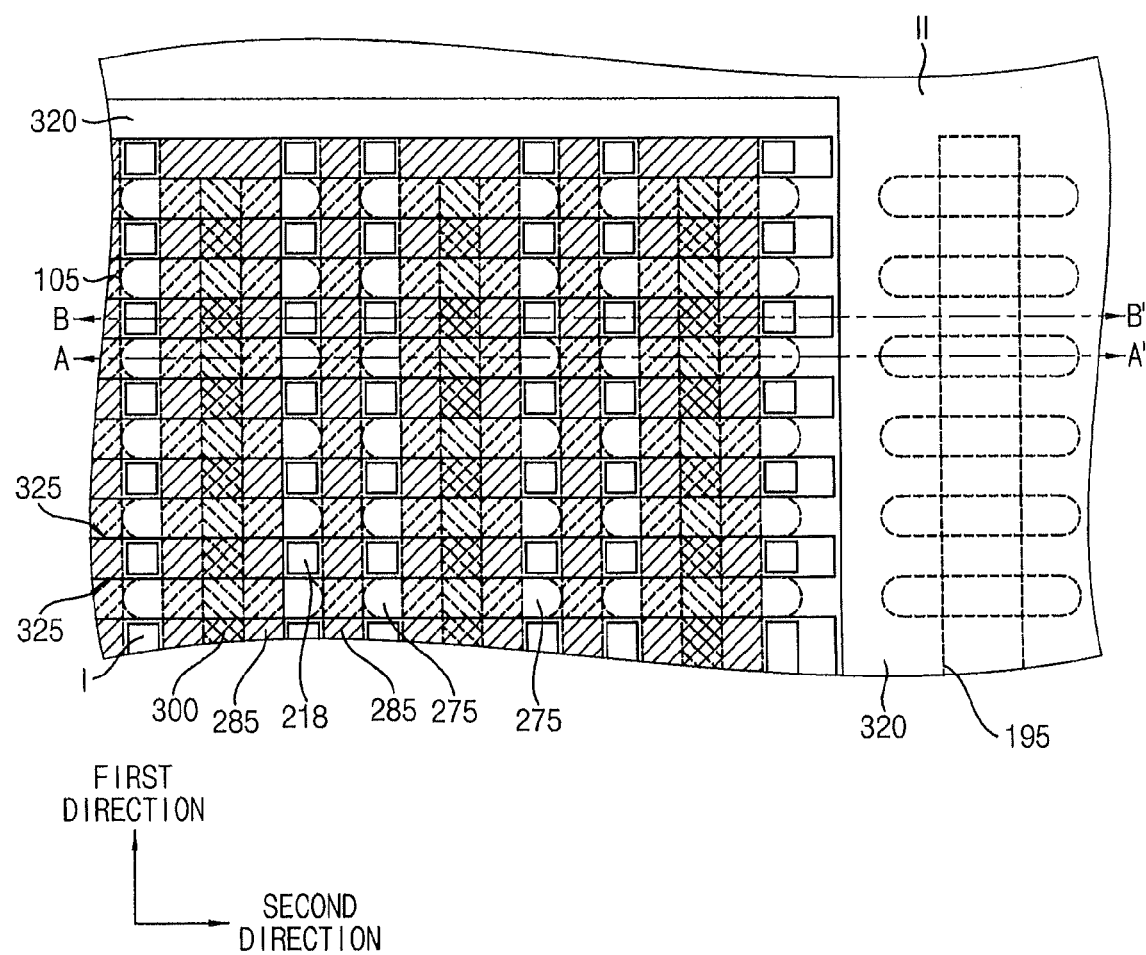

Referring to FIGS. 34 and 35, the second capping layer 290 and the second patterns 275 may be etched using the fourth mask 320 as an etching mask.

In example embodiments, the etching process may be performed by a dry etching process. When the dry etching process is performed, portions of the first patterns 285 and the third capping layer pattern 310 adjacent to the second patterns 275 may be removed in addition to the second patterns 275, however, the source lines 300 may be protected by the third capping layer pattern 310 such that the source lines 300 are not removed.

During the dry etching process, portions of the etch stop layer 200, the second gate insulation layer 160 and the substrate 100 under the second patterns 275 may also be removed to form ninth openings 218 that expose upper portions of the substrate 100.

Figure 36:
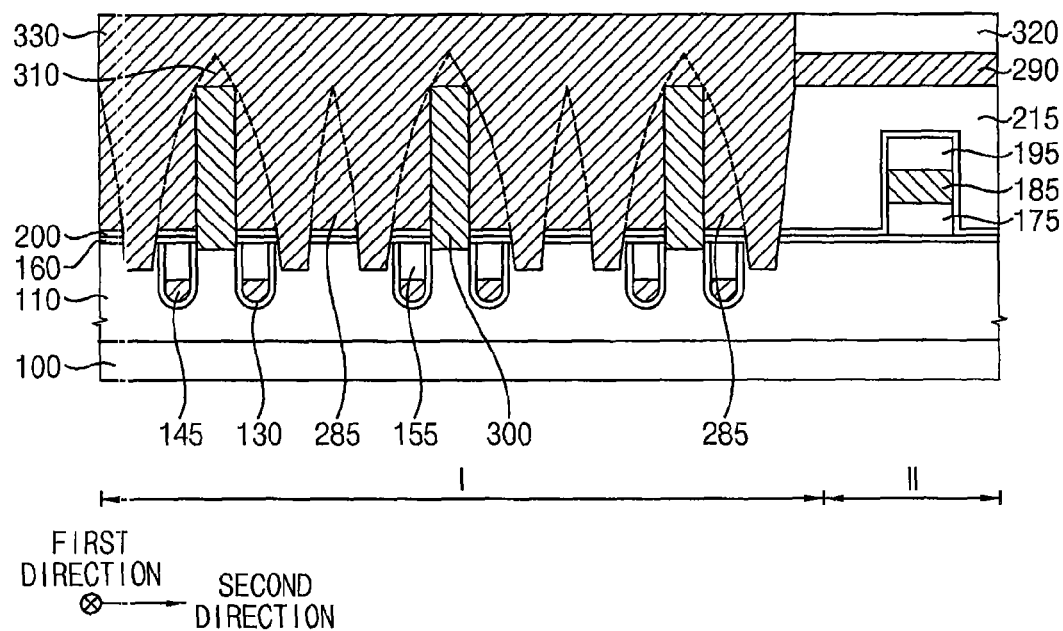
Figure 37:
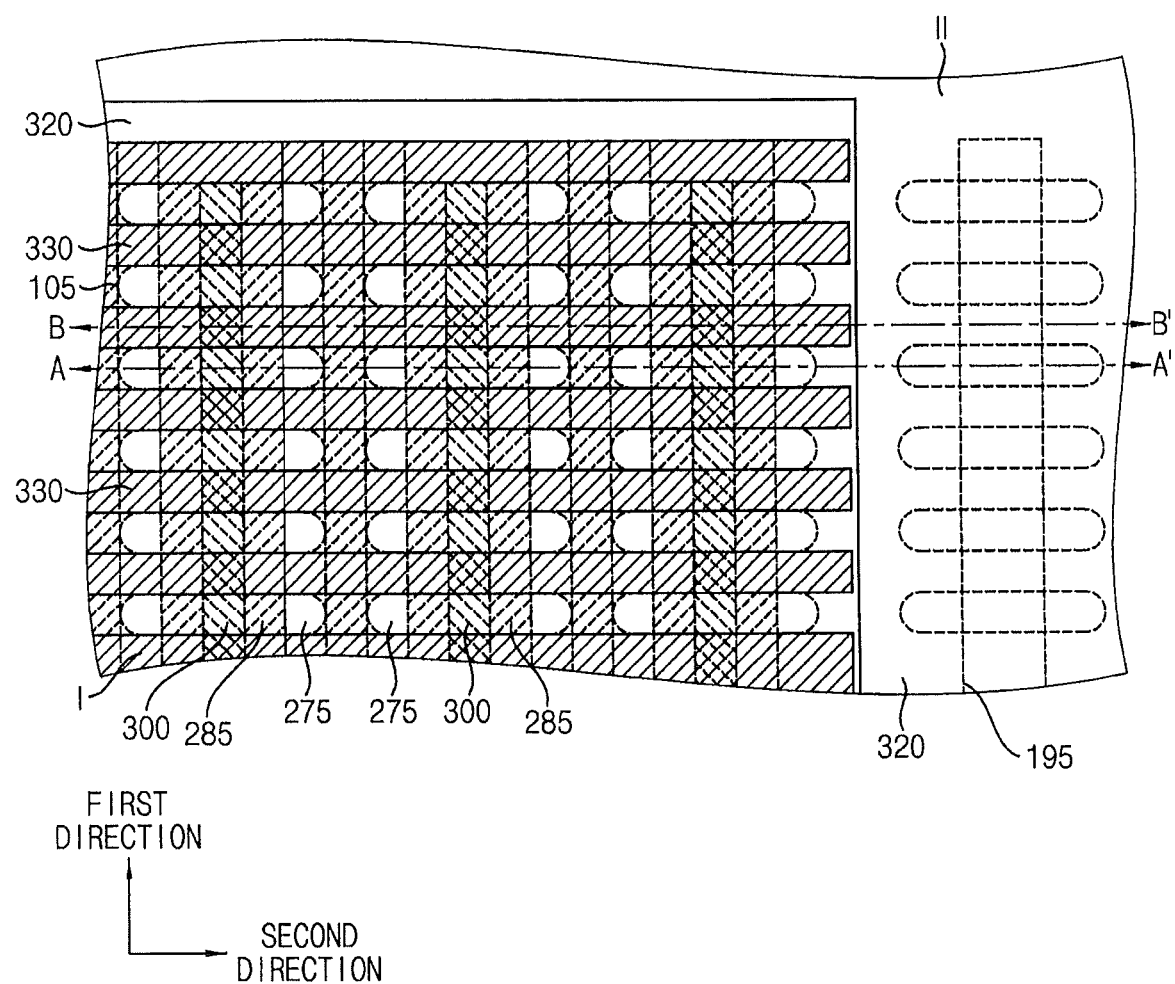
Figure 38:
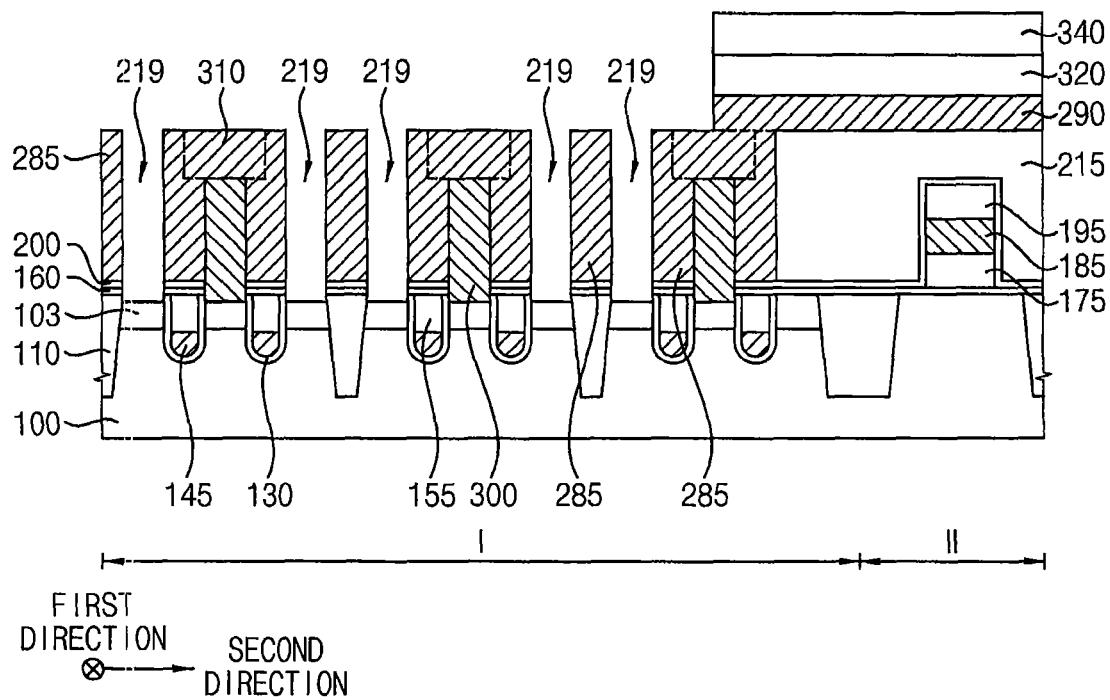
Figure 39:
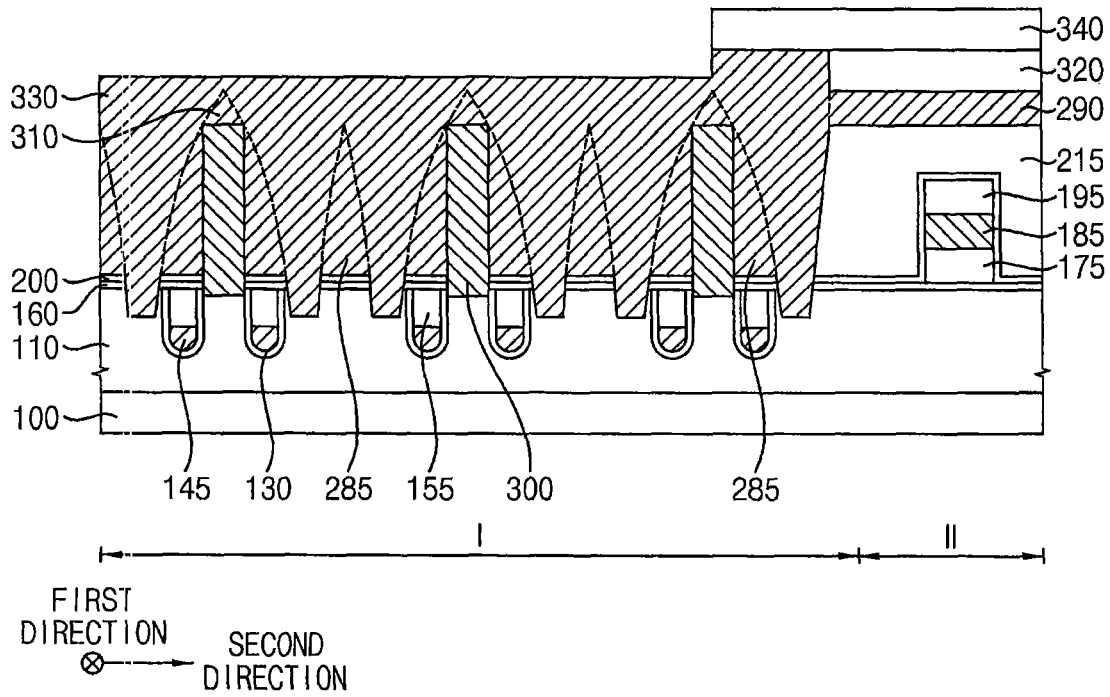

Referring to FIGS. 36 and 37, third patterns 330 may be formed that fill the ninth openings 218.

The third patterns 330 may be formed by forming a first insulation layer on the substrate 100, the first patterns 285, the third capping layer pattern 310 and the fourth mask 320 to sufficiently fill the ninth openings 218, and then planarizing an upper portion of the first insulation layer. In an example embodiment, the planarization process may be performed until an upper portion of the fourth mask 320 is removed. The first insulation layer may include, e.g., silicon nitride, thereby being merged into the first patterns 285, the third capping layer pattern 310 and the second capping layer 290.

In example embodiments, each third pattern 330 may extend in the second direction, and a plurality of third patterns 330 may be spaced apart from each other in the first direction, as is shown in FIG. 37.

Thus, sidewalls of the second patterns 275 may be surrounded by the first and third patterns 285 and 330.

Referring to FIGS. 38 to 41, a third photoresist pattern 340 may be formed on the second capping layer 290. Then, the third patterns 330 and the fourth mask 320, the second capping layer 290, the third patterns 330, the third capping layer pattern 310 and the fourth mask 320 may be etched using the third photoresist pattern 340 as an etching mask to expose the second patterns 275.

The third photoresist pattern 340 may cover the second region II and a portion of the first region I adjacent thereto. In example embodiments, the third photoresist pattern 340 may cover the second region II, portions of closest ones of the source lines 300 to the second region II in the second direction, and portions of closest ones of the third patterns 330 to the second region II in the first direction. Thus, the sacrificial layer pattern 215 in the second region II may be protected during the etching process.

The etching process that is used to expose the second patterns 275 may be a dry etching process. The dry etching process may expose the second patterns 275 which have sidewalls that may be surrounded by the first and third patterns 285 and 330 in the first region I. During the dry etching process, an upper portion of the third capping layer pattern 310 may be removed so that a top surface of the third capping layer pattern 310 may be substantially coplanar with top surfaces of the first, second and third patterns 285, 275 and 330.

Then, the exposed second patterns 275 and portions of the etch stop layer 200 and the second gate insulation layer 160 thereunder may be removed to form tenth openings 219 that expose upper portions of the substrate 100.

In example embodiments, the exposed second patterns 275 may be removed by a wet etching process using hydrofluoric acid as an etching solution, and the portions of the etch stop layer 200 and the second gate insulation layer 160 may be removed by a dry etching process.

Referring to FIGS. 42 to 45, contact plugs 350 may be formed that fill the respective tenth openings 219.

The contact plugs 350 may be formed by forming a second conductive layer on the substrate 100, the first and third patterns 285 and 330, the third capping layer pattern 310 and the fourth mask 320, and then planarizing an upper portion of the second conductive layer. In example embodiments, a top surface of the contact plugs 350 may be formed to be substantially coplanar with the top surfaces of the first and third patterns 285 and 330 and the third capping layer pattern 310.

The second conductive layer may include a metal, e.g., tungsten, titanium, tantalum, etc., and/or a metal nitride, e.g., tungsten nitride, titanium nitride, tantalum nitride, etc.

The contact plugs 350 may be formed both in the first and second directions, and each contact plug 350 may contact an impurity region 103 of the substrate 100. In example embodiments, two contact plugs 350 may be formed in the second direction between two source lines 300.

Figure 46:
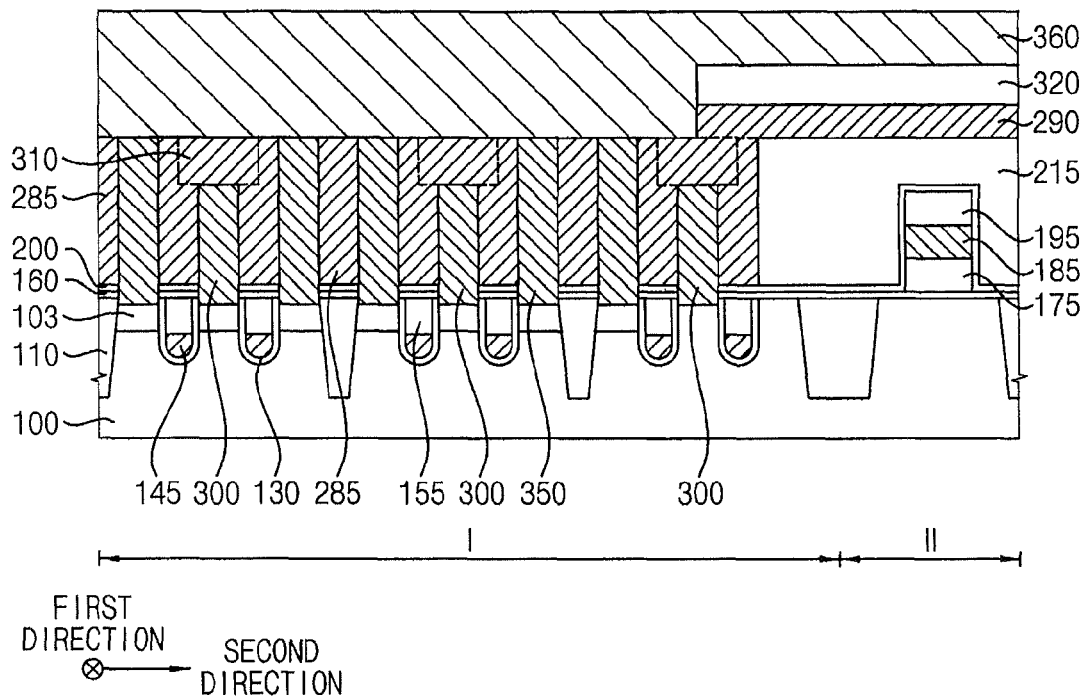

Referring to FIG. 46, a pad layer 360 may be formed on the first and third patterns 285 and 330, the third capping layer pattern 310, the contact plugs 350 and the fourth mask 320.

The pad layer 360 may include a metal, e.g., tungsten, titanium, tantalum, etc., and/or a metal nitride, e.g., tungsten nitride, titanium nitride, tantalum nitride, etc.

Figure 47:
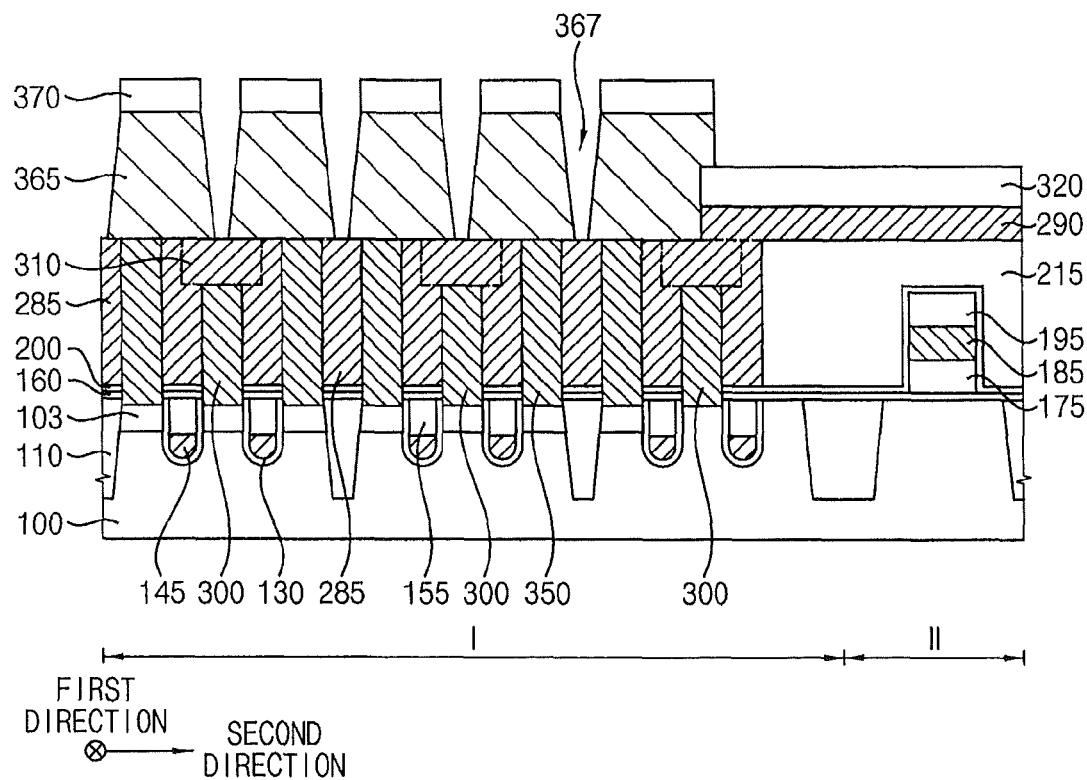
Figure 48:
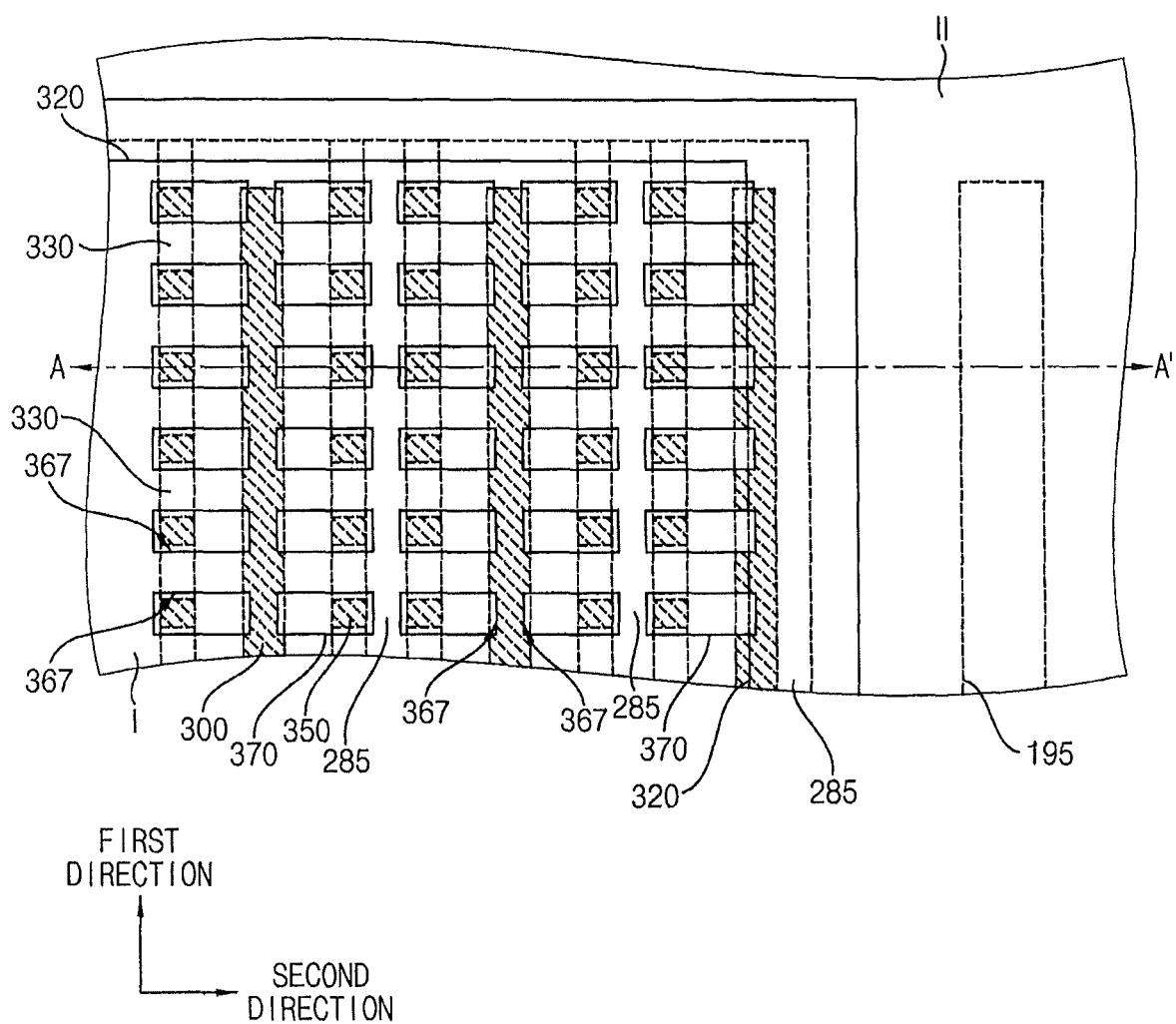

Referring to FIGS. 47 and 48, a fifth mask 370 may be formed on the pad layer 360, and the pad layer 360 may be patterned using the fifth mask 370 as an etching mask to form a plurality of pads 365.

In example embodiments, the pads 365 may cover the contact plugs 350, and each pad 365 may have a width in the second direction that is wider than a width of each contact plug 350.

A space between the pads 365 is shown as an eleventh opening 367 in FIGS. 47 and 48.

Figure 49:
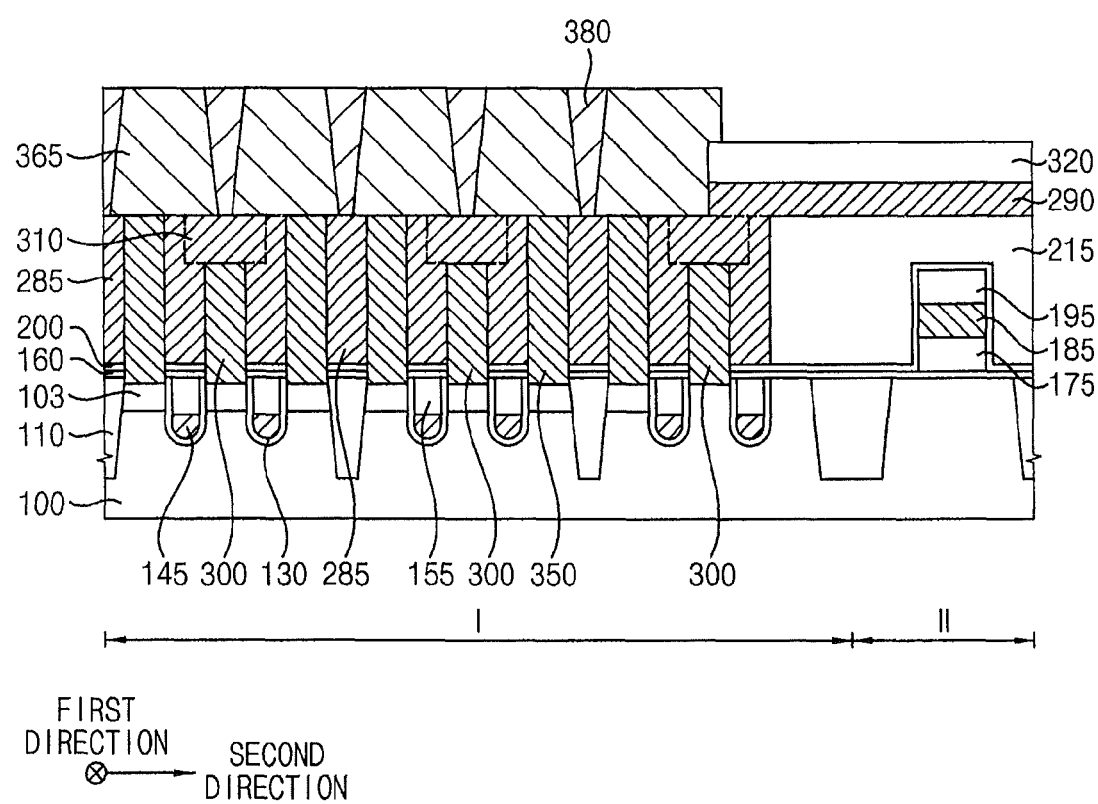
Figure 50:
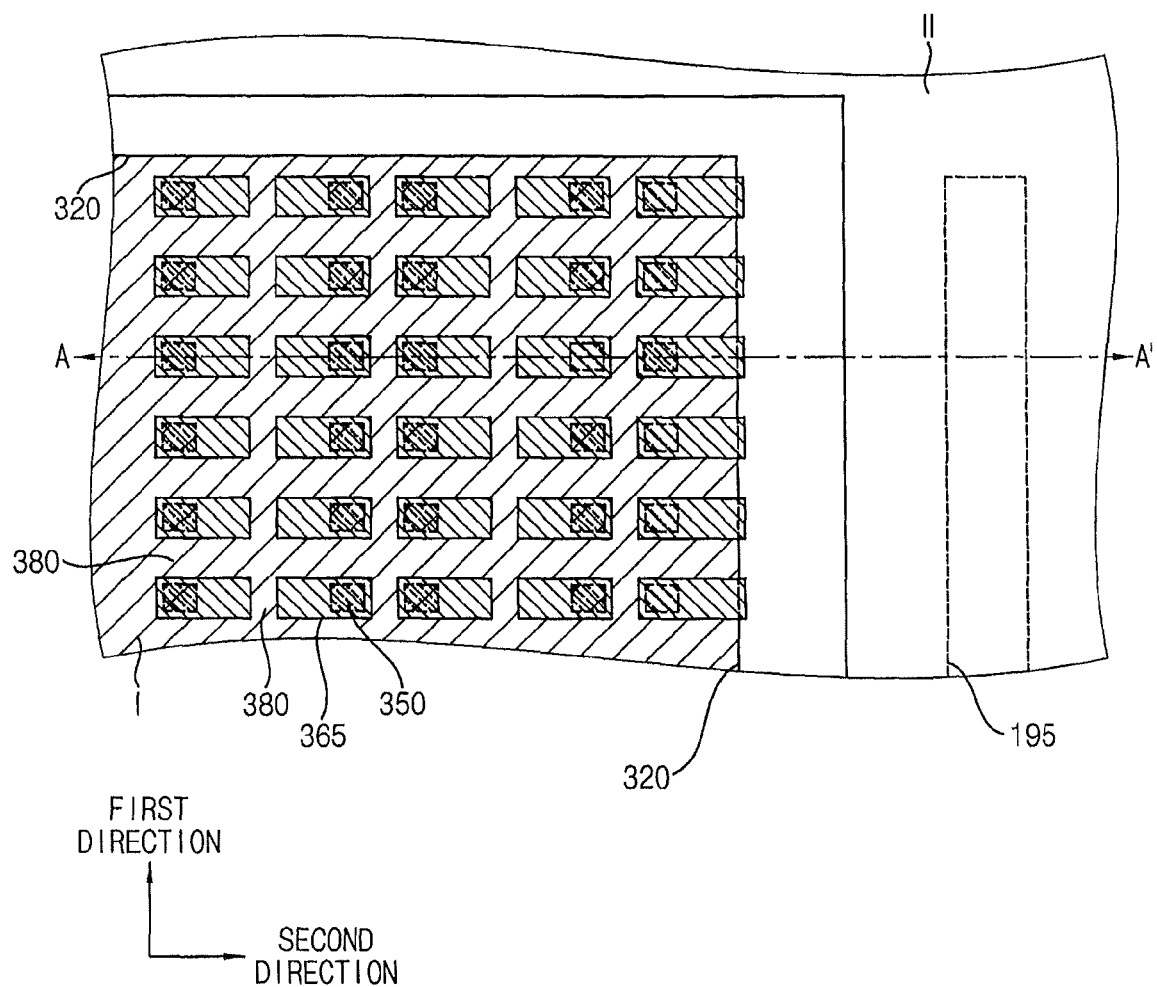

Referring to FIGS. 49 and 50, a second insulation layer 380 may be formed that fills the eleventh openings 367.

The second insulation layer 380 may include, e.g., silicon nitride.

Figure 51:
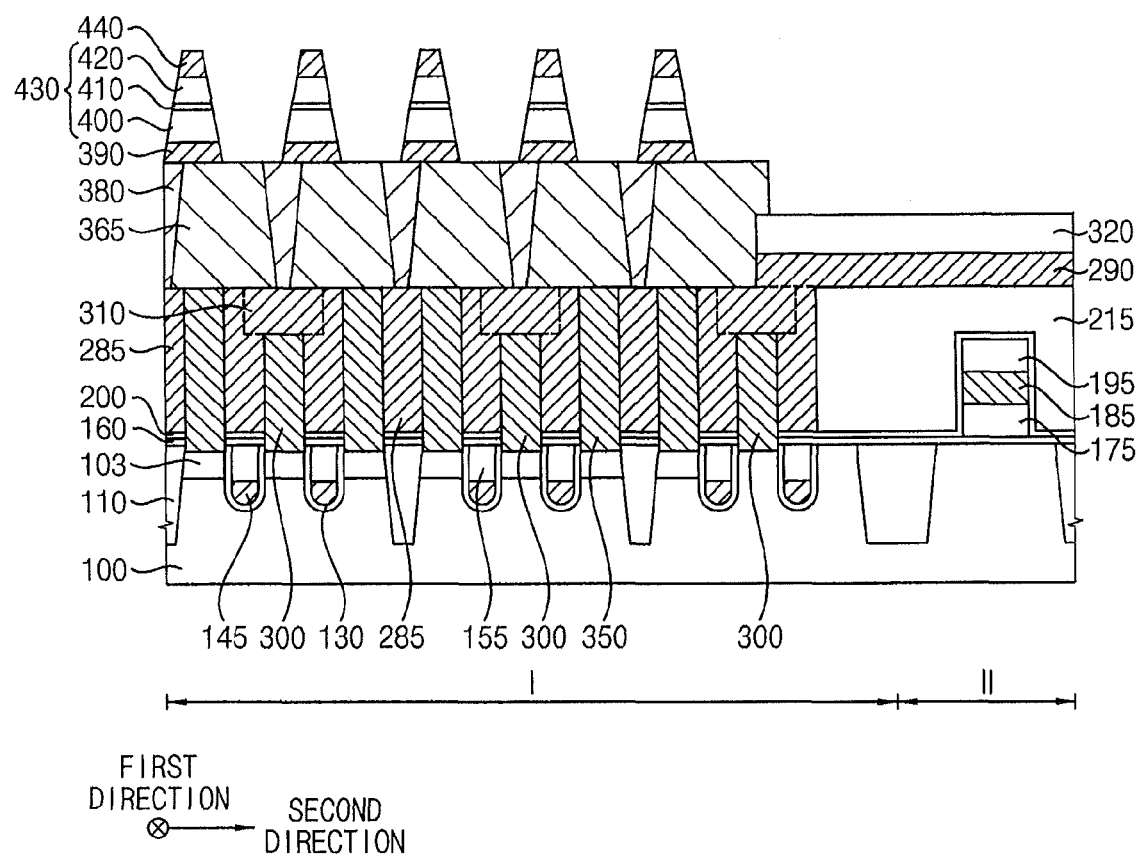
Figure 52:
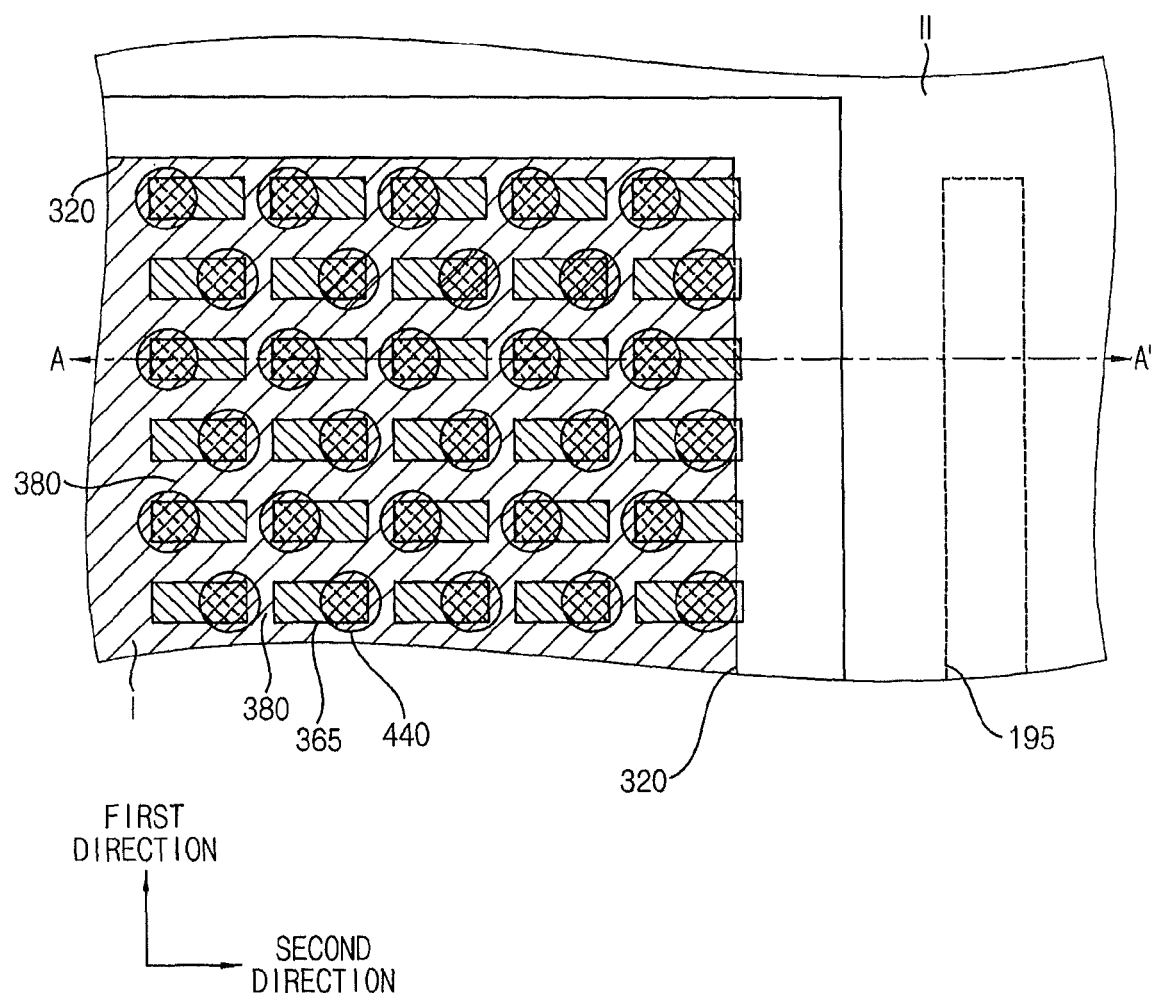

Referring to FIGS. 51 and 52, a lower electrode 390, a magnetic tunnel junction (MTJ) structure 430 and an upper electrode 440 that are sequentially stacked on each pad 365 may be formed. In an example embodiment, the MTJ structure 430 may include a fixed layer structure pattern 400, a tunnel barrier layer pattern 410 and a free layer pattern 420 that are sequentially stacked.

The electrodes 390, 440 and MTJ structures 430 may be formed by sequentially forming a lower electrode layer, a fixed layer structure, a tunnel barrier layer, a free layer and an upper electrode layer on the pads 365, the second insulation layer 380 and the fourth mask 320. The upper electrode layer may be patterned by a photolithography process to form the upper electrode 440. By a dry etch process using the upper electrode 440 as an etching mask, the free layer, the tunnel barrier layer, the fixed layer structure and the lower electrode layer may be patterned to form the lower electrode 390, the fixed layer structure pattern 400, the tunnel barrier layer pattern 410 and the free layer pattern 420 that are sequentially stacked on each pad 365.

The lower and upper electrode layers may include a metal and/or a metal nitride.

A barrier layer (not shown) may be further formed on the lower electrode layer to reduce or prevent any tendency for a metal of the fixed layer structure to grow abnormally. The barrier layer may include an amorphous metal or a metal nitride, e.g., tantalum, tantalum nitride, titanium, titanium nitride, etc.

In an example embodiment, the fixed layer structure may include a pinning layer, a lower ferromagnetic layer, antiferromagnetic coupling spacer layer and an upper ferromagnetic layer.

The pinning layer may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, Cr, etc. The lower and upper ferromagnetic layers may include, e.g., Fe, Ni, Co, etc. The anti-ferromagnetic coupling spacer layer may include, e.g., Ru, Ir, Rh, etc.

The tunnel barrier layer may include, e.g., aluminum oxide or magnesium oxide.

The free layer may include, e.g., Fe, Ni, Co, etc.

The dry etching process using the upper electrode 440 as an etching mask may include, e.g., a plasma reaction etching process or a sputtering process. The plasma reaction etching process, if used, may be performed using an etching gas containing a fluorine-containing gas and ammonia gas, and a reaction gas containing oxygen for reducing the consumption of the upper electrode 440.

The MTJ structure 430 and the process for forming the MTJ structure 430 may not be limited to the above description.

Referring to FIGS. 53 and 54, a second insulating interlayer 450 may be formed on the pads 365, the second insulation layer 380 and the fourth mask 320 to cover the lower electrode 390, the MTJ structure 430 and the upper electrode 440. Then, a bit line 460 may be formed on the second insulating interlayer 450 that contacts the upper electrodes 440 to complete the manufacture of the MRAM device.

The second insulating interlayer 450 may include, e.g., silicon oxide, and the bit line 460 may include, e.g., a metal, a metal nitride and/or a metal silicide. In example embodiments, the bit line 460 may extend in the second direction, and a plurality of bit lines 460 may be spaced apart from each other in the first direction.

As illustrated above, the MRAM device may be manufactured by forming very fine (small) first and second patterns 285 and 275 on the substrate 100 by triple patterning technology (TPT), removing the second patterns 275 by a wet etching process to form the openings 217 and 219, and forming source lines 300 and contact plugs 350 in the openings 217 and 219. Thus, very fine source lines 300 and contact plugs 350 may be formed, and failures due to short circuits between the source lines 300 and the contact plugs 350 may be reduced or prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a magnetoresistive random access memory (MRAM) device, comprising:
   forming first and second patterns on a substrate alternately and repeatedly in a second direction that is substantially parallel to a top surface of the substrate, each of the first patterns and each of the second patterns extending in a first direction that is substantially parallel to the top surface of the substrate and substantially perpendicular to the second direction;
   removing some of the second patterns to form first openings each of which extends in the first direction;
   forming source lines in the first openings;
   forming a mask on the first and second patterns and the source lines, the mask including a plurality of second openings that are spaced apart from each other in the first direction, each of the second openings extending in the second direction;
   removing portions of the second patterns that are exposed by the second openings to form third openings;
   forming third patterns in the third openings;
   removing additional ones of the second patterns that are surrounded by the first and third patterns to form fourth openings; and
   forming contact plugs in the fourth openings.

2. The method of claim 1, wherein a wet etching process is used to form both the first openings and the fourth openings.

3. The method of claim 1, wherein the first and third patterns comprise substantially a same material.

4. The method of claim 1, wherein forming the first openings comprises removing each (3n−2)th of the second patterns when the second patterns are counted along the second direction, wherein n is a positive integer.

5. The method of claim 1, further comprising forming a first capping layer on the first and second patterns.

6. The method of claim 5, wherein the first capping layer comprises a material that is substantially the same as that of the first patterns.

7. The method of claim 1, wherein forming the first openings includes:
   removing upper portions of selected ones of the second patterns and upper portions of the first patterns adjacent thereto by a dry etching process to form recesses while not etching other of the second patterns; and
   removing lower portions of the selected ones of the second patterns by a wet etching process to form the first openings, the first openings being in fluid communication with the recesses.

8. The method of claim 7, wherein forming the source lines includes:
   forming a conductive layer in the first openings and in the recesses; and
   removing portions of the conductive layer in the recesses.

9. The method of claim 8, further comprising forming a second capping layer in the recesses after removing the portions of the conductive layer in the recesses.

10. The method of claim 9, wherein the second capping layer comprises a material substantially the same as that of the first patterns.

11. The method of claim 9, wherein forming the third openings includes removing the portions of the second patterns exposed by the second openings by a dry etching process while using the second capping layer to protect the source lines during the dry etching process.

12. The method of claim 1, wherein the first and second patterns comprise silicon nitride and silicon oxide, respectively.

13. The method of claim 1, wherein forming the first and second patterns includes:
   forming a plurality of sacrificial layer patterns on the substrate, each of the sacrificial layer patterns extending in the first direction, and the sacrificial layer patterns being spaced apart from each other in the second direction;
   forming first spacers on sidewalls of the sacrificial layer patterns;
   removing the sacrificial layer patterns;
   forming second spacers that contact the first spacers;
   forming a filling layer on the substrate, the filling layer filling spaces between the second spacers; and
   removing upper portions of the first and second spacers and the filling layer to convert the first spacers and the filling layer into the first patterns and to convert the second spacers into the second patterns.

14. A method of manufacturing a magnetoresistive random access memory, (MRAM) device, the method comprising:
   forming a plurality of active regions in a substrate, the active regions spaced apart from each other along a second direction;
   forming a pair of first gate structures in each active region;
   forming sacrificial patterns between the pairs of first gate structures, the sacrificial patterns extending in a first direction that is perpendicular to the second direction and spaced apart from each other along the second direction;
   forming first spacers on sidewalls of the sacrificial patterns;
   removing the sacrificial patterns; and
   forming second spacers that fill openings between each pair of adjacent first spacers that overlie a common active region and that only partially fill openings between each pair of adjacent first spacers that overlie different active regions, the second spacers including an insulating material.

15. The method of claim 14, further comprising:
   forming a filling layer on the first spacers and the second spacers and in the openings between each pair of adjacent first spacers that overlie different active regions; and
   planarizing the filling layer to convert the first spacers and the remaining filling layer into first patterns and to convert the second spacers into second patterns, the first and second patterns being formed alternately and repeatedly in the second direction.

16. The method of claim 15, further comprising:
   removing some of the second patterns to form first openings which extend in the first direction; and
   forming source lines in the first openings.

17. The method of claim 16, further comprising:
   forming a mask on the first and second patterns and the source lines, the mask including a plurality of second openings that are spaced apart from each other in the first direction, each of the second openings extending in the second direction;
   removing portions of the second patterns that are exposed by the second openings to form third openings; and
   forming third patterns in the third openings.

18. The method of claim 16, further comprising:
   removing additional ones of the second patterns that are surrounded by the first and third patterns to form fourth openings; and
   forming contact plugs in the fourth openings.

19. The method of claim 15, wherein each first spacer overlies a respective first gate structure.

20. A method of manufacturing a magnetoresistive random access memory (MRAM) device, the method comprising:
   forming a plurality of active regions in a substrate, the active regions spaced apart from each other along a second direction;
   forming a pair of first gate structures in each active region;
   forming sacrificial patterns between the pairs of first gate structures, the sacrificial patterns extending in a first direction that is perpendicular to the second direction and spaced apart from each other along the second direction, and the sacrificial patterns including an insulating material;
   forming first spacers directly on sidewalls of the sacrificial patterns;
   removing the sacrificial patterns; and
   forming second spacers that fill openings between each pair of adjacent first spacers that overlie a common active region and that only partially fill openings between each pair of adjacent first spacers that overlie different active regions.

* * * * *